United States Patent [19]
Fujihira

[11] Patent Number: 5,593,926
[45] Date of Patent: Jan. 14, 1997

[54] METHOD OF MANUFACTURING SEMICONDUCTOR DEVICE

[75] Inventor: Mitsuaki Fujihira, Yokohama, Japan

[73] Assignee: Sumitomo Electric Industries, Ltd., Osaka, Japan

[21] Appl. No.: 319,546

[22] Filed: Oct. 7, 1994

[30] Foreign Application Priority Data

Oct. 12, 1993 [JP] Japan .................. 5-253978

[51] Int. Cl.$^6$ .................................................. H01L 21/60
[52] U.S. Cl. .................. 437/209; 437/210; 437/214; 437/226; 437/227; 148/DIG. 28
[58] Field of Search ................. 437/209, 210, 437/211, 212, 213, 214, 226, 227; 148/DIG. 28

[56] References Cited

U.S. PATENT DOCUMENTS

| | | | |
|---|---|---|---|
| 3,978,578 | 9/1976 | Murphy | 437/227 |
| 4,263,087 | 4/1981 | Tanabe et al. | 437/925 |
| 4,833,102 | 5/1989 | Byrne et al. | 437/220 |
| 4,883,773 | 11/1989 | Ishikura | 148/DIG. 28 |
| 4,904,610 | 2/1990 | Shyr | 437/227 |
| 5,100,809 | 3/1992 | Nakashima et al. | 437/210 |
| 5,208,178 | 5/1993 | Usami | 437/925 |
| 5,358,590 | 10/1994 | Yamanaka | 437/226 |
| 5,393,706 | 2/1995 | Mignardi et al. | 148/DIG. 28 |

*Primary Examiner*—Kevin M. Picardat
*Attorney, Agent, or Firm*—Beveridge, DeGrandi, Weilacher & Young, LLP

[57] ABSTRACT

A method of manufacturing a semiconductor device having a package including a base, and a chip mounted on the base, wherein the chip has a surface on which an element is formed, the method comprising the steps of (a) fixing the chip having a protective coat formed on the surface to the base; and (b) removing the protective coat from the chip without touching the chip.

8 Claims, 35 Drawing Sheets

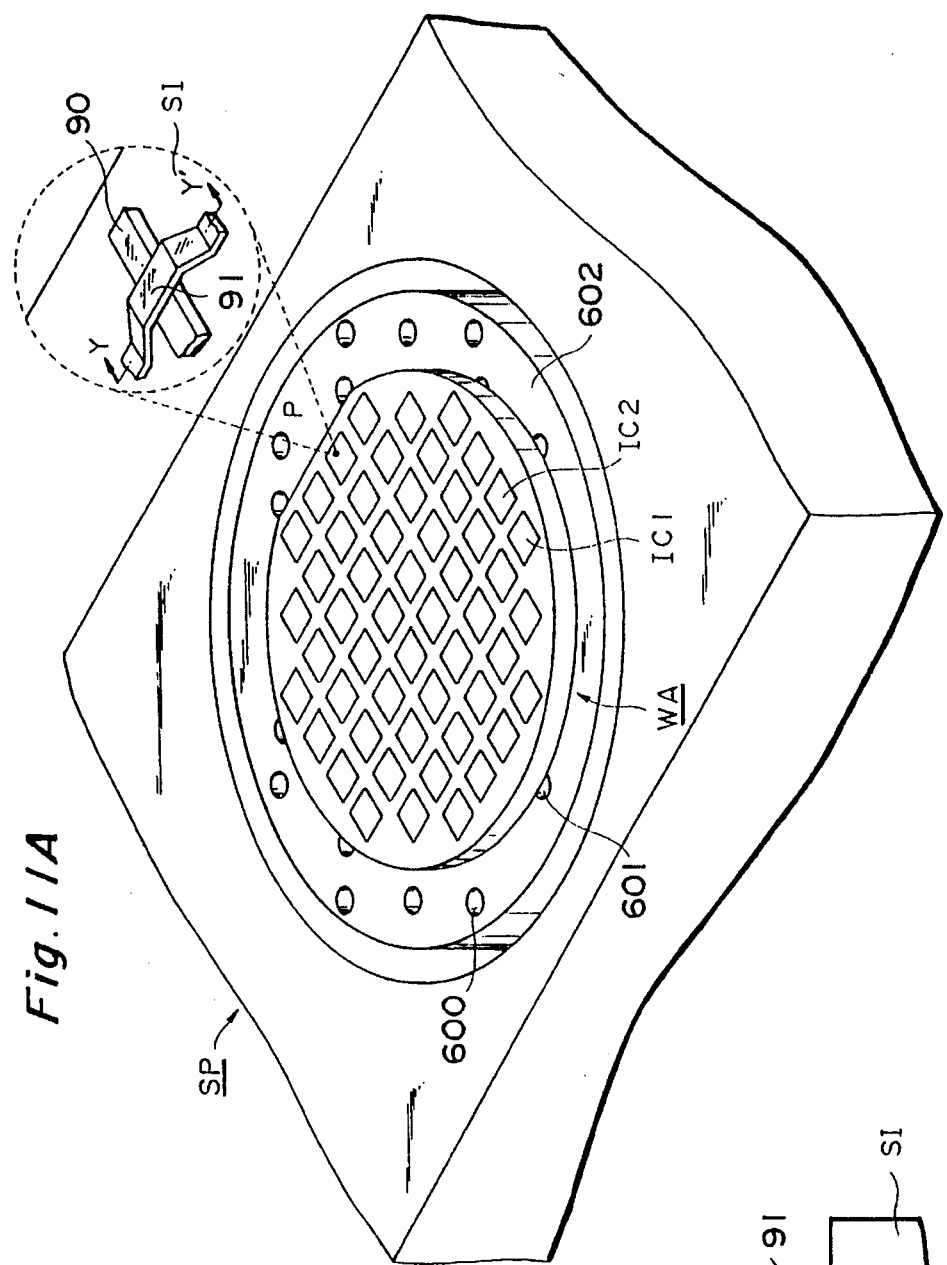
Fig. 11A
Fig. 11A(a)
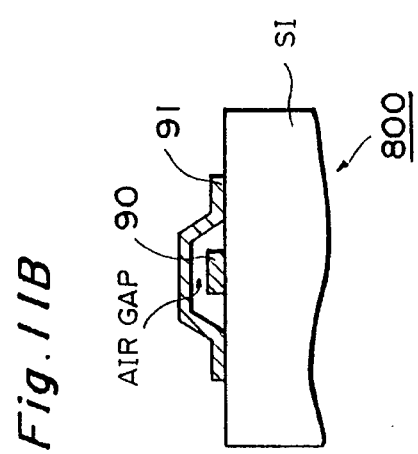
Fig. 11B

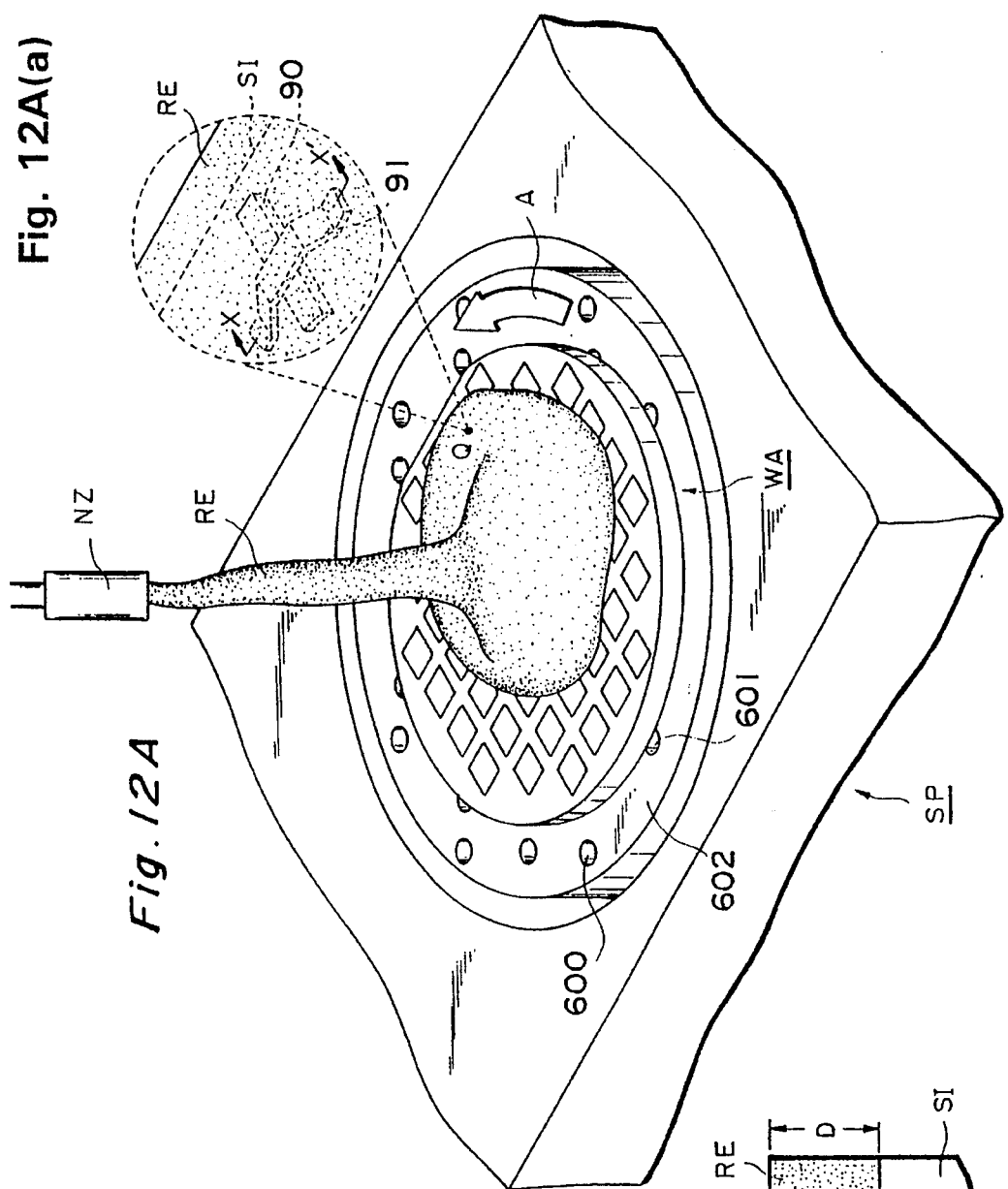
Fig. 12A(a)
Fig. 12A
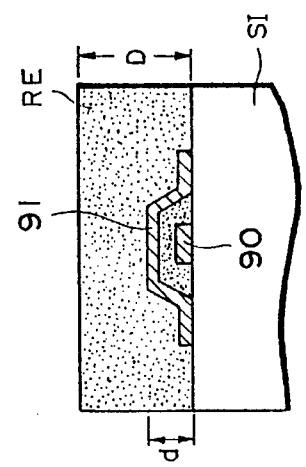
Fig. 12B

METHOD OF MANUFACTURING SEMICONDUCTOR DEVICE

BACKGROUND OF THE INVENTION

The present invention relates to a method of manufacturing a semiconductor device and, more particularly, to a method of manufacturing a semiconductor device capable of packaging, at a high yield, a chip whose surface need not be protected since the chip forms wiring layers constituting an air bridge structure.

SUMMARY OF THE INVENTION

It is an object of the present invention to provide a method of manufacturing a semiconductor device having a package including a base, and a chip mounted on the base. The chip has a surface on which an element is formed. The method according to present invention comprises the steps of:

(a1) fixing the chip having a protective coat (resist or resist film) formed on the surface to the base; and (b1) removing the protective coat from the chip without touching the chip.

Note that, the step (a1) is performed before (b1). Thus, when removing the coat from the chip, the chip can be handled by only touching the base or package, which protects the chip and surface of the chip.

A method according to present invention comprises the steps of:

(a2) fixing said chip having a protective coat formed on said surface to said base; and (b2) handling said chip having said protective coat and moving said chip to a removing space without touching said chip directly to remove said protective coat from said chip in said removing space.

Note that, the step (a2) is performed before (b2). Thus, when moving the chip to the removing space such as a space in a vessel filled with solvent of the coat, the chip can be handled by only touching the base or package, which protects the chip and surface of the chip. Further, the chip can be handled without touching the chip after removing the temporary protective coat.

A method according to present invention comprises the steps of:

(a3) fixing said chip having a protective coat formed on said surface to said base; and (b3) handling said base fixed to said chip having said protective coat and moving said chip to a removing space to remove said protective coat from said chip in said removing space.

Note that, the step (a3) is performed before (b3). Thus, when moving the chip to the removing space such as a space in a vessel filled with solvent, the chip can be handled by only touching the base, which protects the chip and surface of the chip. Further, the chip can be handled without touching the chip after removing the temporary protective coat.

A method according to present invention comprises the steps of:

(a4) handling said chip having a protective coat formed on said surface and moving said chip to said base without touching said surface directly; and (b4) removing said protective coat from said chip on said base.

Thus, when moving the chip to the base, the chip can be handled by touching the protective coat, which protects the chip and surface of the chip. Further, the chip can be handled without touching the chip after removing the temporary protective coat.

In other words, when mounting and fixing the chip in the package or on the base, since the protective film such as resist is formed on the chip, the chip can be mounted in the package by using a collet. After the chip is mounted in the package, the package can be handled, and the chip need not be directly handled. Therefore, the chip and the element formed on the chip are not destroyed.

The method is effective when a wiring layer constituting an air bridge structure is formed on the surface. The method of manufacturing the wiring layer constituting the air bridge structure, the method of manufacturing the wiring layers constituting the air bridge structure has the steps of:

(c) forming first, second, and third wiring layers on the substrate;

(d) coating a resist on an exposed surface of the substrate and on the first, second, and third wiring layers;

(e) removing the resist on regions on the first and second wiring layers, thereby exposing a surface of the first wiring layer and a surface of the second wiring layer;

(f) forming a wiring layer serving as a bridge on an exposed surface of the first wiring layer, an exposed surface of the second wiring layer, and an exposed surface of a remaining portion of the resist; and (g) removing the resist arranged between the wiring layer serving as the bridge and the substrate.

A manufacturing method according to present invention comprises:

(a') the step of coating a resist on a first surface of a substrate, the first surface of the substrate having wiring layers constituting an air bridge structure;

(b') the step of dicing the substrate having the resist, thereby forming a chip from the substrate, the resist being formed on a first surface of the chip, (c') the step of mounting the chip having the resist formed thereon in a package; and (d') the step of cleaning the package, which is mounted with the chip on which the resist is formed, by using a solvent that dissolves the resist. Therefore, in the step (d'), the resist is removed from the chip. Note that the step (c') is performed before the step (d'). Thus, when mounting the chip in the package, since the resist is formed on the chip, the chip can be mounted in the package by using a collet. After the chip is mounted in the package, the package can be handled, and the chip need not be directly handled. Therefore, the chip and the air bridge formed on the chip are not destroyed.

The present invention comprises, after the step (d'), (e') the step of cleaning the package with water. The solvent is washed away, and the package and the chip are cleaned with water.

The present invention comprises, after the step (e'), (f') the step of drying the package. The package wet with water is dried in this drying step. The step (e') includes the step of heating the package at a pressure lower than the atmospheric pressure. When the package and the chip are heated in a vacuum, they can be quickly dried. After drying, the package and the chip are bonded by using wires. Since the package has been cleaned, when connecting the package and the chip, good contact characteristics can be obtained. Thereafter, the package is sealed by using a lid.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 11A and 11A(a) are perspective views showing a state wherein a wafer WA is placed on a spinner SP, in which a portion surrounded by a broken line is an enlarged illustration FIG. 11A(a) of a region at a point P. This illustration indicates wiring layers 90 and 91 having the air bridge structure.

FIG. 11B is a sectional view of the wafer WA taken along the line segment Y–Y' of FIG. 11A. An air gap exists between the wiring layers 90 and 91.

FIGS. 12A and 12A(a) are perspective views showing a state wherein a resist (protective coat) RE is being coated on the wafer (substrate) WA. During coating, the spinner SP is rotating. A portion surrounded by a broken line in FIG. 12A is an enlarged illustration FIG. 12A(a) of a region at a point Q. This illustration depicts the wiring layers 90 and 91 having the air bridge structure.

FIG. 12B is a sectional view of the wafer WA taken along the line segment X–X' of FIG. 12A. A resist RE exists between the wiring layers 90 and 91 to reinforce the wiring layer 91. A portion of the resist RE arranged on the wiring layer 91 protects the wiring layer 91.

FIG. 19 is a view showing a state wherein the package PK, in which the chip 700a is arranged, is arranged in an oven OB. The package PK is heated to 150° C., and the adhesive AD solidifies. The chip 700a is handled by touching the package PK, then the chip 700a is handled without touching the chip 700a.

DESCRIPTION OF THE PREFERRED EMBODIMENTS

The preferred embodiments of the present invention will be described with reference to the accompanying drawings.

Prior to a description of a method of manufacturing a semiconductor device according to the preferred embodiments of the present invention, the wiring layers constituting an air bridge structure will be described first, and then a semiconductor device manufacturing method established by the present inventors will be described. A description on the semiconductor device manufacturing method will be made with reference to FIGS. 1 to 4, and thereafter semiconductor device manufacturing methods according to the preferred embodiments of the present invention will be described with reference to FIGS. 5 to 27I. The embodiments of the present invention that will be described with reference to FIGS. 5 to 27I exemplify semiconductor device manufacturing methods which are very excellent in terms of protection of the semiconductor device in the manufacturing steps when compared to the semiconductor device manufacturing method described with reference to FIGS. 1 to 4.

Figure 1:
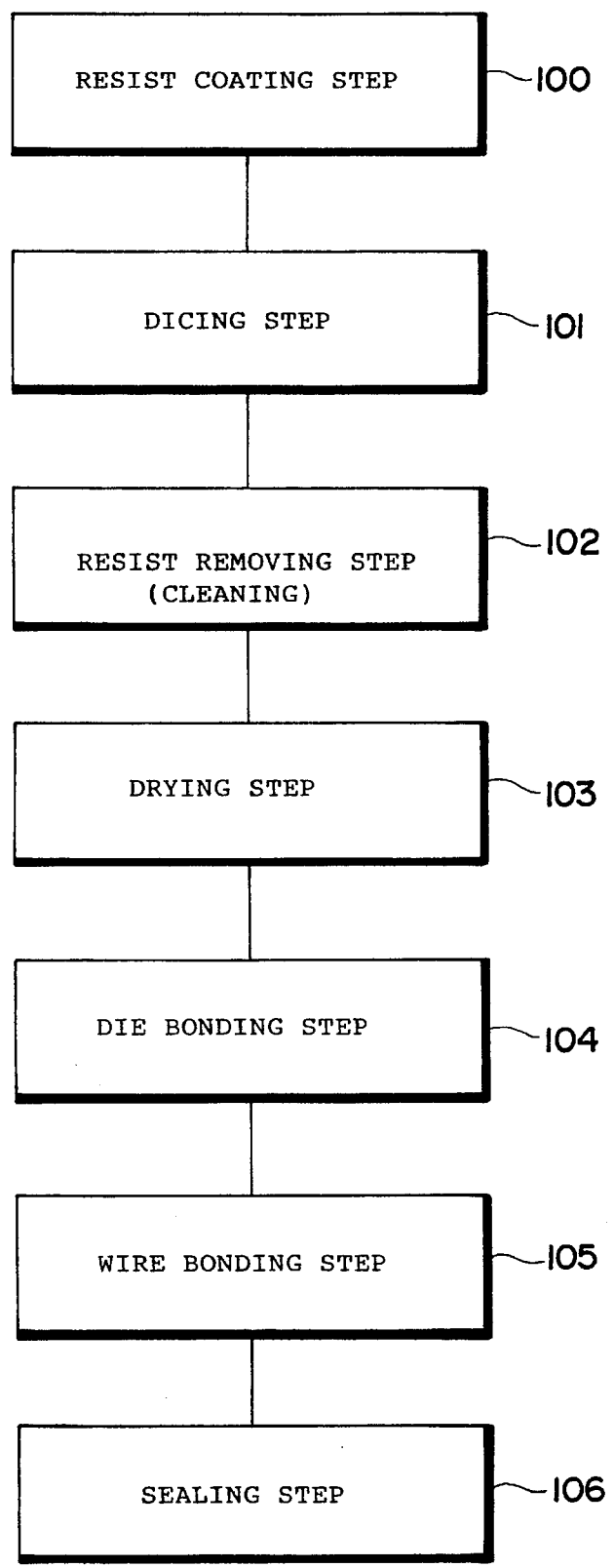
FIG. 1 is a flow chart showing a method of manufacturing a semiconductor device.
Figure 10:
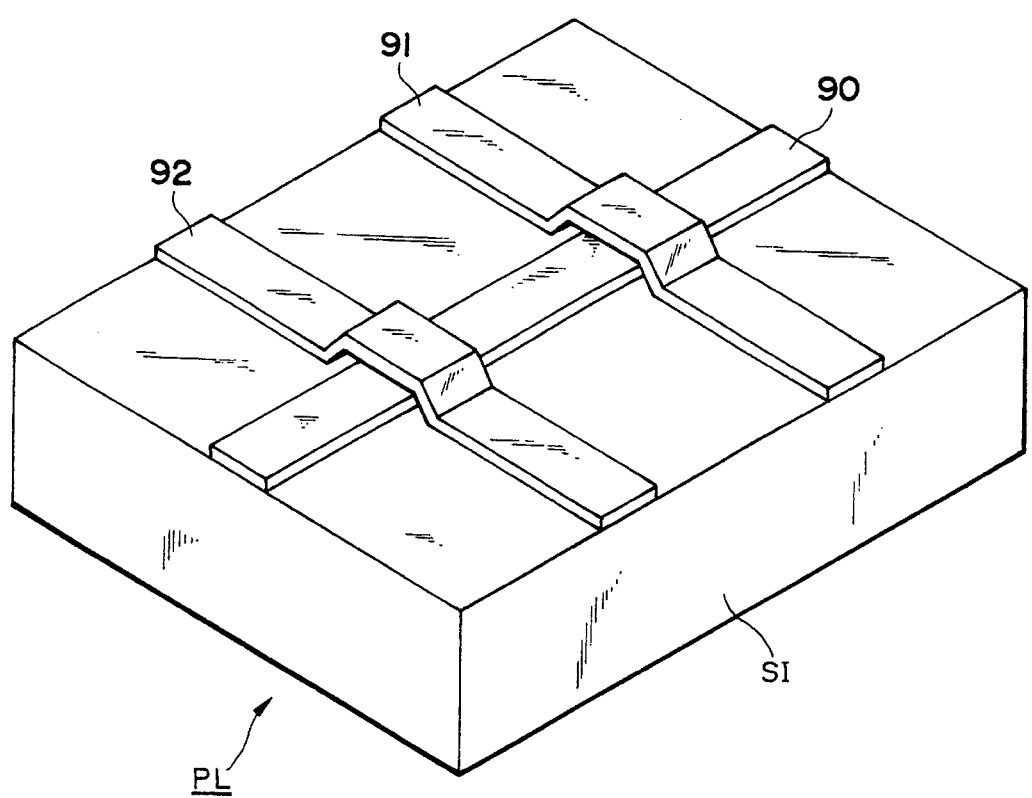
FIG. 10 is a perspective view of the wiring layers 90 to 92 and a substrate SI for explaining the air bridge structure.

An air bridge wiring structure is a structure in which a plurality of wiring layers 90 to 92 intersect each other through spaces on a semiconductor substrate SI, as shown in the perspective view of FIG. 10. When this structure is employed, the parasitic capacitance formed at the intersecting portions of the wiring layers 90 to 92 can be sufficiently minimized. FIG. 1 is a flow chart showing the steps of a method of manufacturing a semiconductor device by packaging a semiconductor wafer having wiring layers constituting the air bridge structure. This manufacturing method is executed in accordance with the order shown in FIG. 1.

Figure 2A:
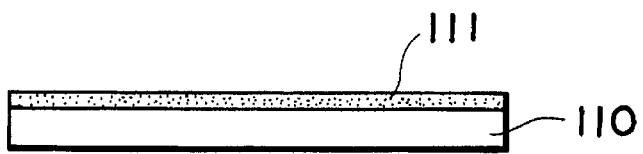
FIGS. 2A to 2H are views showing the method of manufacturing a semiconductor device in accordance with the flow chart shown in FIG. 1.

In a resist coating step 100, as shown in FIG. 2A, a resist 111 is coated on the upper surface (a surface on which the wiring layers 90 to 92 are formed) of a semiconductor wafer 110 that forms wiring layers constituting the air bridge structure shown in FIG. 10.

Figure 2B:
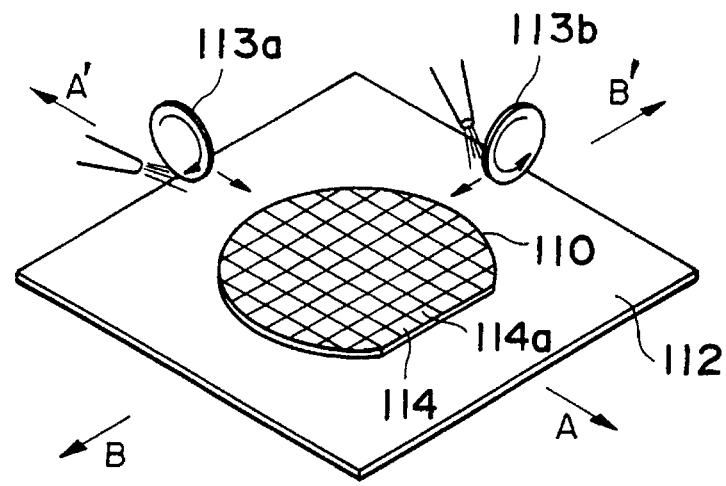

In a dicing step 101, as shown in FIG. 2B, the semiconductor wafer 110 is fixed on a wafer fixing tape 112, and is diced into a plurality of chips by using diamond saws 113a and 113b. This dicing is performed by flowing grinding water. After the wafer 100 is diced, the wafer fixing tape 112 is pulled in directions A–A' and B–B' of FIG. 2B. By this pulling operation, spaces each capable of receiving the distal ends of a pair of tweezers are formed among chips 114 and 114a obtained by dicing.

Figure 2C:
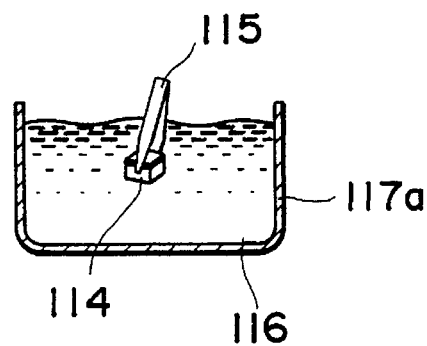

In a resist removing step 102, as shown in FIG. 2C, each diced chip 114 is nipped with a pair of tweezers 115 and dipped in a solvent 116, e.g., acetone, thereby removing the resist 111 on the chip 114.

Figure 2D:
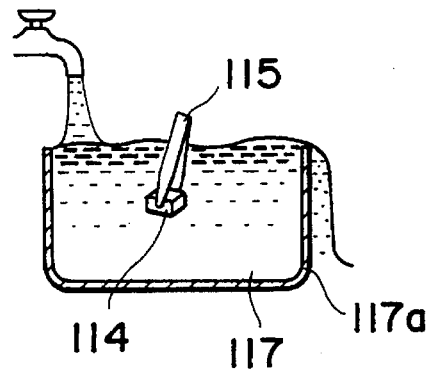

After the resist 111 is removed, the chip 114 is dipped in deionized water (pure water) 117, as shown in FIG. 2D, and is rinsed with the deionized water 117 (cleaning).

Figure 2E:
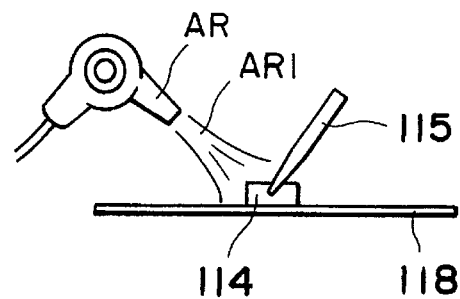

In a drying step 103, as shown in FIG. 2E, the chip 114 is placed on filter paper 118. Air AR1 is blown off to the chip 114 by using a blower AR, thereby drying the chip 114.

Figure 2F:
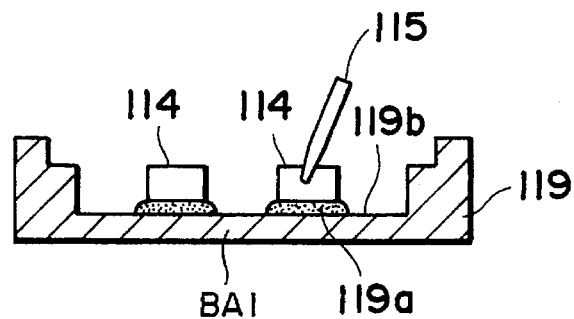

In a die bonding step 104, as shown in FIG. 2F, the chip 114 is die-bonded on an inner surface 119b of a ceramic package 119 including a base BA1 with an adhesive 119a, e.g., an epoxy resin.

In this case, the chip 114 is nipped with the tweezers 115, moved to above the adhesive 119a, and fixed in the package 119.

Figure 2G:
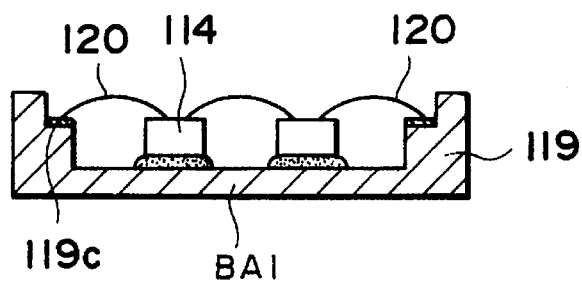

In a wire bonding step 105, as shown in FIG. 2G, the chip 114 and a wire bonding pad formed on the ceramic package 119 are connected with an Au wire 120.

Figure 2H:
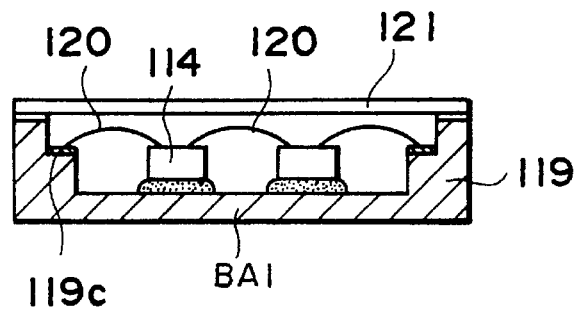

In a sealing step 106, as shown in FIG. 2H, the package 119 is hermetically sealed by covering it with a lid 121. When the step 106 described with reference to FIG. 2H ends, the semiconductor device shown in FIG. 2H is completed.

The present inventors manufactured a semiconductor device having an air bridge structure on an experimental basis by employing the semiconductor device manufacturing method described above with reference to FIG. 1 and FIGS. 2A to 2H in a laboratory. As a result, the present inventors found out that there is still room for improvement in the semiconductor device manufacturing method described with reference to FIG. 1 and FIGS. 2A to 2H.

In the above procedure, in the steps 102 to 104, the chip 114 need be nipped with the tweezers 115. The chip 114 is sometimes partially broken when it is nipped with the tweezers 115. In the steps 102 to 104, the present inventors executed the operation very carefully in order to prevent partial chip breaking. However, even with the greatest attention, some of the many chips 114 were partially broken and, if great attention was not paid, many chips were partially broken. The present inventors noted that the manufacturing yield of the semiconductor devices was largely degraded by employing the step of nipping the chip 114 with the tweezers 115.

Figures 3, 3A:
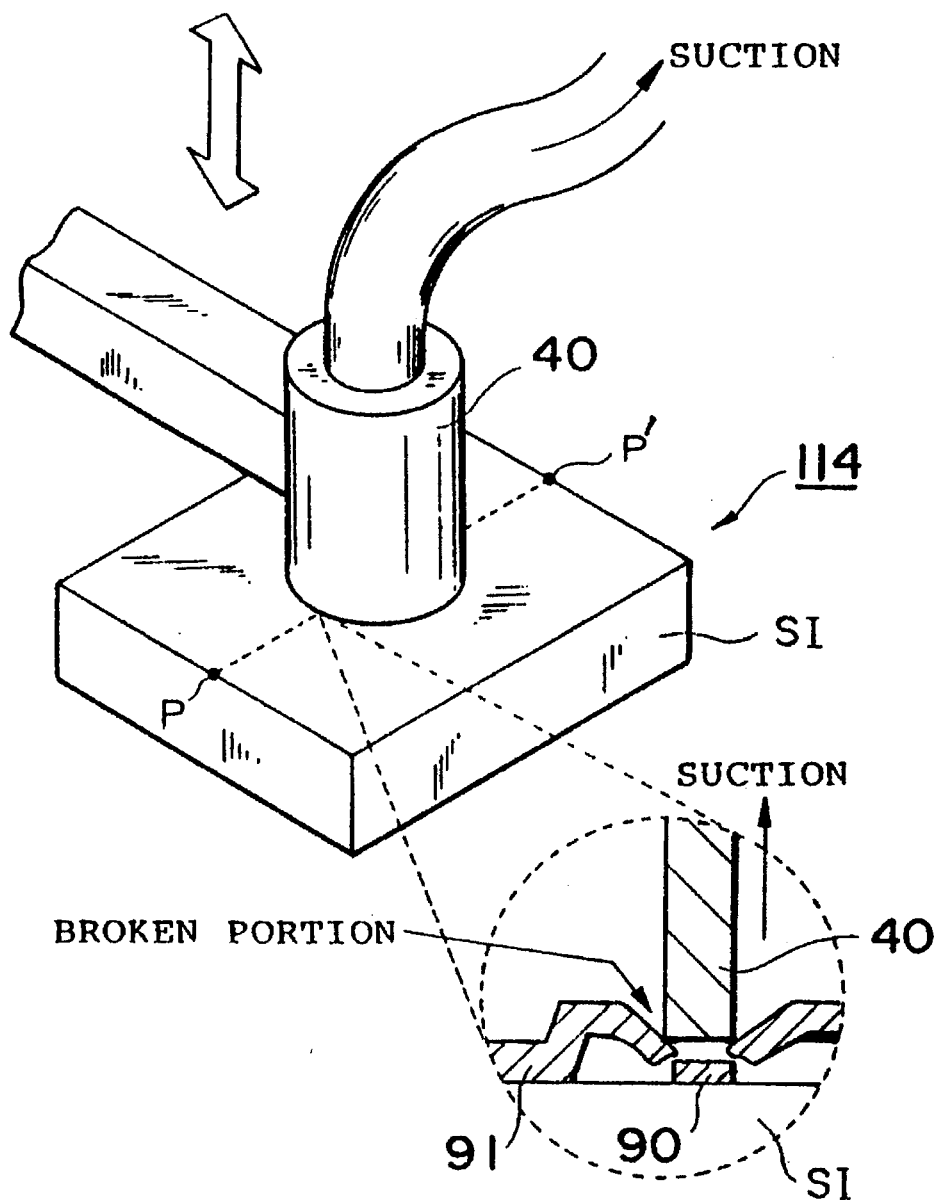
FIG. 3 and 3(a) show a state wherein a chip 114 is being picked up with a collet 40, in which a portion surrounded by a broken line is an enlarged sectional view (FIG. 3(a)) taken along the line segment P–P' of FIG. 3. A wiring layer 91 of the chip 114 is destroyed when brought into contact with the collet 40.
Figures 4, 4A:
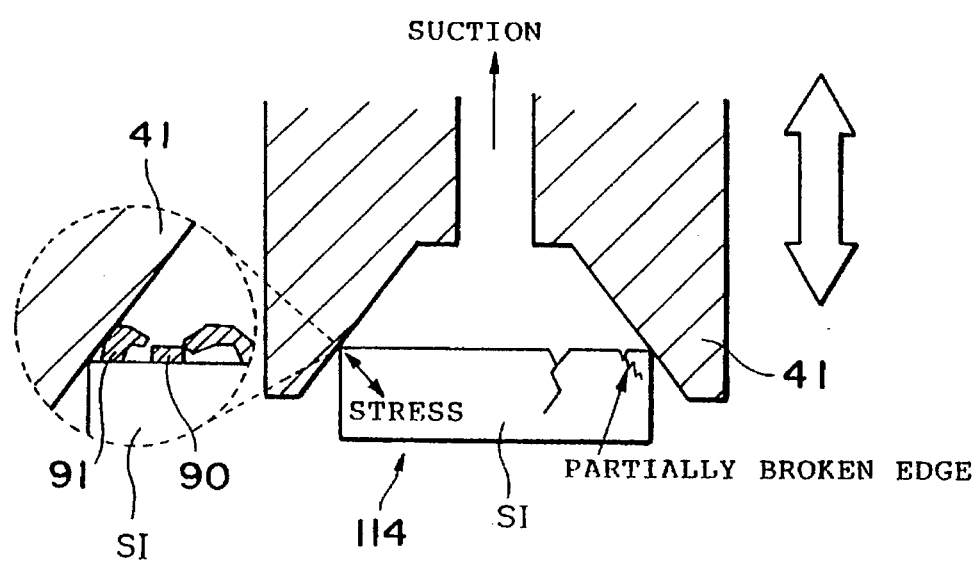
FIGS. 4 and 4(a) are sectional views showing a state wherein a chip 114 is being picked up by using a pyramidal collet 41.

In view of the foregoing, the present inventors manufactured semiconductor devices by using collets 40 and 41 shown in FIGS. 3, 3(a) and 4 in placed of the tweezers 115. The collet 40 or 41 is a suction unit like a vacuum pump and holds a member which is brought into contact with a hollow object by evacuating air in the object.

FIGS. 3 and 3(a) are perspective views showing a state wherein the semiconductor substrate SI shown in FIG. 10 is held by using the collet 40 in the step 104 described with reference to FIG. 2F. In FIGS. 3, and 3(a) a portion surrounded by a broken line is a partially enlarged illustration of a portion of a section of the semiconductor substrate SI on a line connecting points P–P'.

When the collet 40 shown in FIGS. 3 and 3(a) is used, the wiring layer 91 formed on the surface of the semiconductor substrate SI and having an air bridge structure is destroyed as it is pressed against the collet 40.

FIGS. 4 and 4(a) are views showing a state wherein the semiconductor substrate SI shown in FIG. 10 is held by using the collet 41 in the step 104 described with reference to FIG. 2F. In FIGS. 4 and 4(a) a portion surrounded by a broken line is a partially enlarged illustration of a portion of the semiconductor substrate SI which is in contact with the collet 41.

When the pyramidal collet 41 shown in FIGS. 4 and 4(a) is used, the wiring layer 91 formed on the surface of the semiconductor substrate SI and having an air bridge structure is destroyed as it is pressed against the collet 41. Since the pyramidal collet 41 exerts a stress to the semiconductor substrate SI, when a force of the pyramidal collet 41, which acts to attract the semiconductor substrate SI is large, the semiconductor substrate SI is destroyed.

In the step 102 shown in FIGS. 2C and 2D, the chip 114 is dipped in liquids 116 and 117. Thus, although the tweezers 115 can be used, the ordinary collet 40 or 41 described above cannot be used. The collets 40 and 41 can be used after the liquids 116 and 117 are removed from a container 117a. However, as described above, when the collet 40 or 41 is used, the wiring layer 91 having the air bridge structure or the semiconductor substrate SI is destroyed.

Also in the step 103 shown in FIG. 2E, the tweezers 115 or the collet 40 or 41 are used. As described above, when the collet 40 or 41 is used, the wiring layer 91 having the air bridge structure or the semiconductor substrate SI is destroyed.

Therefore, in the present invention, prevention of destruction of the wiring layer 91 having the air bridge structure and the semiconductor substrate SI is the point that needs improvement.

According to the present invention, destruction of the wiring layer 91 having the air bridge structure and the semiconductor substrate SI is prevented. Accordingly, the present invention provides a semiconductor device manufacturing method having a high manufacturing yield by this destruction prevention.

The preferred embodiments of the semiconductor device manufacturing method of the present invention will be described.

Figure 5:
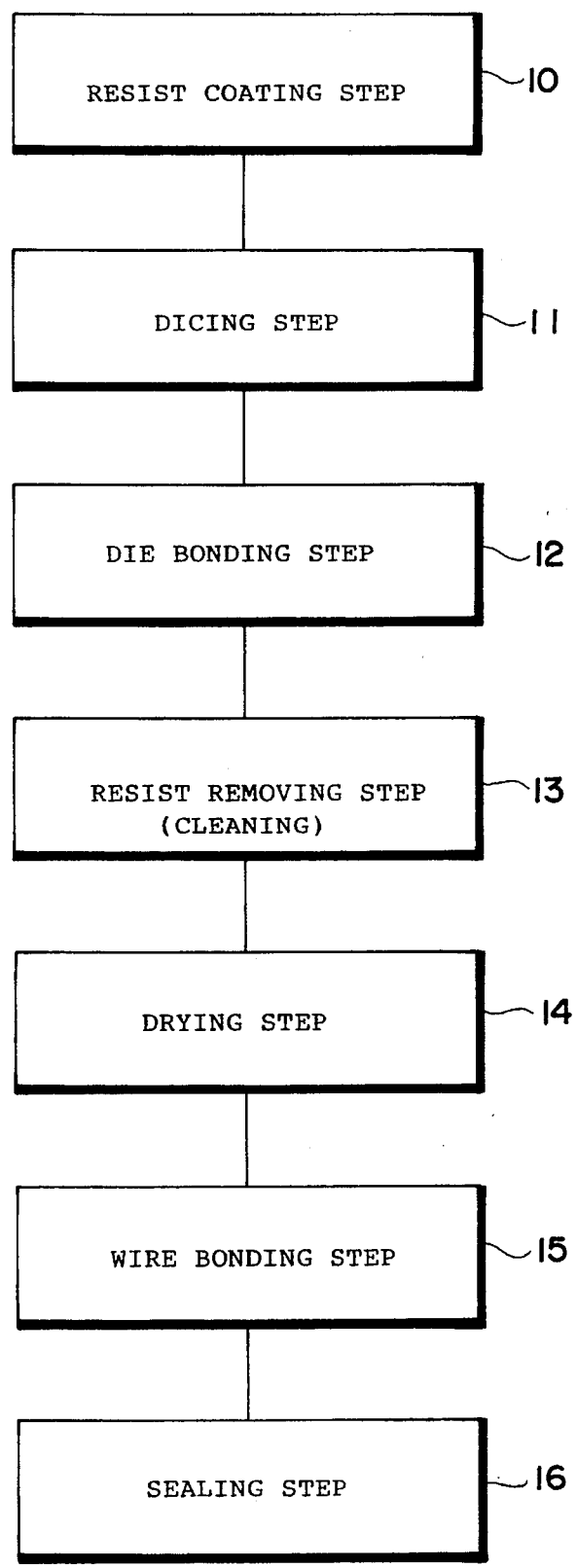
FIG. 5 is a flow chart showing a method of manufacturing a semiconductor device according to an embodiment of the present invention.

FIG. 5 is a flow chart showing the steps of a semiconductor device manufacturing method according to an embodiment of the present invention. As shown in FIG. 5, the semiconductor device manufacturing method according to this embodiment includes a resist coating step 10, a dicing step 11, a die bonding step 12, a resist removing step 13, a drying step 14, a wire bonding step 15, and a sealing step 16. A semiconductor device shown in FIG. 6H can be completed by executing the steps 10 to 16.

Note that these steps 10 to 16 are executed in this order.

First, a semiconductor wafer 20 including a semiconductor substrate SI shown in FIG. 10, on which wiring layers 90 to 92 are formed, is prepared. After this preparation, the following steps 10 to 16 shown in FIGS. 6A to 6H are executed.

Figure 6A:
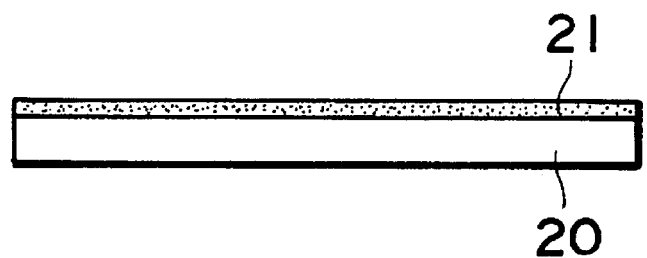
FIGS. 6A to 6H are views showing the method of manufacturing a semiconductor device according to the embodiment shown in FIG. 5 in accordance with the flow chart shown in FIG. 5.

In the resist coating step 10, as shown in FIG. 6A, a resist 21 is coated on a surface (a surface on which the air bridge structure is formed) of the semiconductor wafer 20 on which an air bridge wiring layer has been formed. After the resist 21 is coated on the semiconductor wafer 20, the semiconductor wafer 20 is arranged in a heater (not shown), e.g., an oven, and is baked at a temperature of, e.g., 150° C. for about 15 minutes in the oven. The resist 21 may be a material which is generally used in the manufacture of ICs. By this baking, the resist 21 solidifies. The solidified resist 21 protects the air bridge formed on the surface of the semiconductor wafer 20 in the subsequent dicing step 11. The dicing step 11 will be described in detail.

Figure 6B:
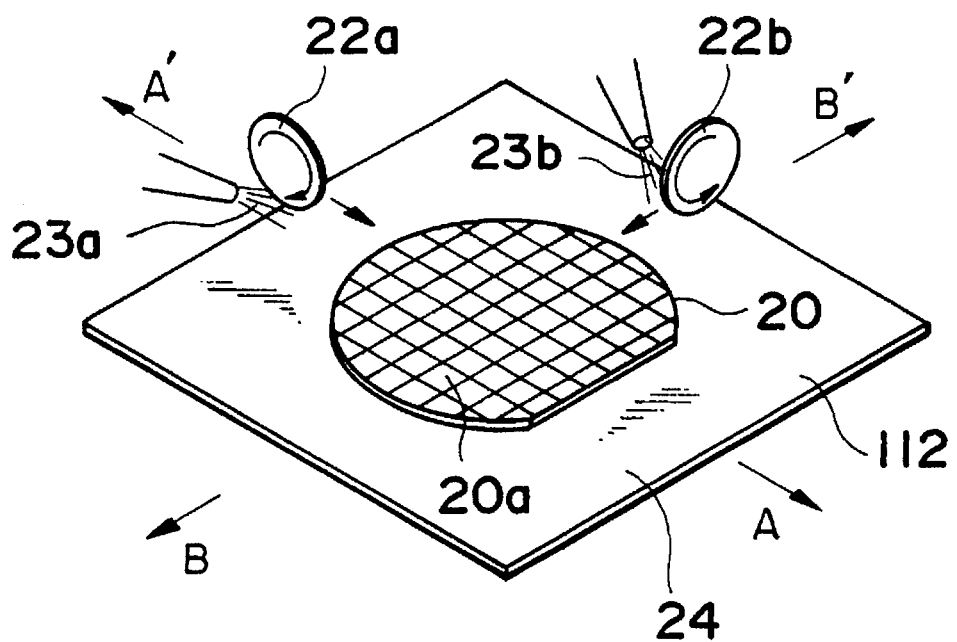

In the dicing step 11, as shown in FIG. 6B, the semiconductor wafer 20 is adhered on the surface of an adhesive tape 112. Then, the semiconductor wafer 20 is diced by using diamond saws 22a and 22b. During this dicing, grinding water jets 23a and 23b are blown off to the semiconductor wafer 20. Blowing of the grinding water jets 23a and 23b to the semiconductor wafer 20 dissipates heat generated at the dicing portions of the diamond saws 22a and 22b and removes cuttings formed during dicing of the semiconductor wafer 20. Wiring layers 90 to 92 constituting the air bridge structure shown in FIG. 10 are formed on the surface of the semiconductor wafer 20. When the grinding water jets 23a and 23b are directly blown off to the wiring layers 90 to 92, of the air bridge, the wiring layer 90 may undesirably collapse by the water pressure, or the wiring layers 90 to may be undesirably disconnected. In the step 10 of this embodiment shown in FIG. 6A, since the resist 21 is coated on the semiconductor wafer 20, the wiring layers to 92 on the semiconductor wafer 20 can be protected from the water pressure of the grinding water jets 23a and 23b.

The resist 21 is especially effective when the wiring layers on the semiconductor wafer 20 constitute an air bridge structure. However, even when wiring layers do not constitute an air bridge structure, the resist 21 is effective if the wiring layer surface need be protected. Accordingly, in addition to semiconductor wafers having wiring layers constituting an air bridge structure, the present invention can also be widely applied to other semiconductor wafers.

The dicing step 11 will be described in detail. In the dicing step 11, first, the semiconductor wafer 20 is adhered on the adhesive surface of a dicing tape 24 and fixed on a dicing unit (not shown). After fixing, the semiconductor wafer 20 is cut with the diamond saws 22a and 22b along scribe lines 20a formed on the semiconductor wafer 20 while flowing the grinding water jets 23a and 23b. Since the resist 21 is coated on the semiconductor wafer 20, the wiring layers 90 to 92 constituting the air bridge structure shown in FIG. 10 will not be damaged by blowing Off the grinding water jets 23a and 23b. Thereafter, the dicing tape 24 is pulled in A–A' and B–B' directions, as shown in FIG. 6B, thereby dividing the semiconductor wafer 20 into individual chips 25.

Figure 6C:
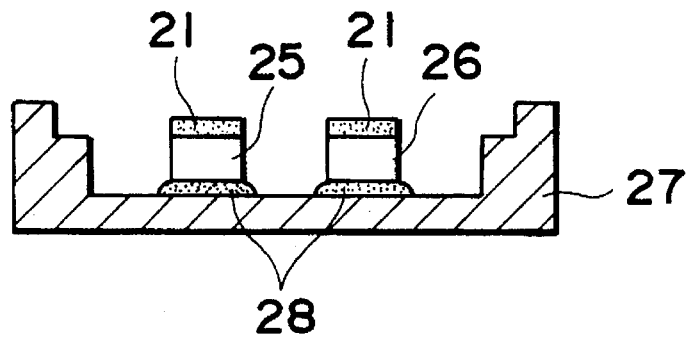

Subsequently, the die bonding step 12 is executed. In the die bonding step 12, as shown in FIG. 6C, the chips 25 and 26 obtained by division are mounted on a base in a ceramic package 27. This mounting is performed by adhering the chips 25 and 26 with the package 27 at normal temperature by using an epoxy—or polyimide—based die bond resin 28 and setting the die bond resin 28 by heat in an oven (not shown). This operation is performed by using an automatic die bonding unit (not shown).

Figure 7:
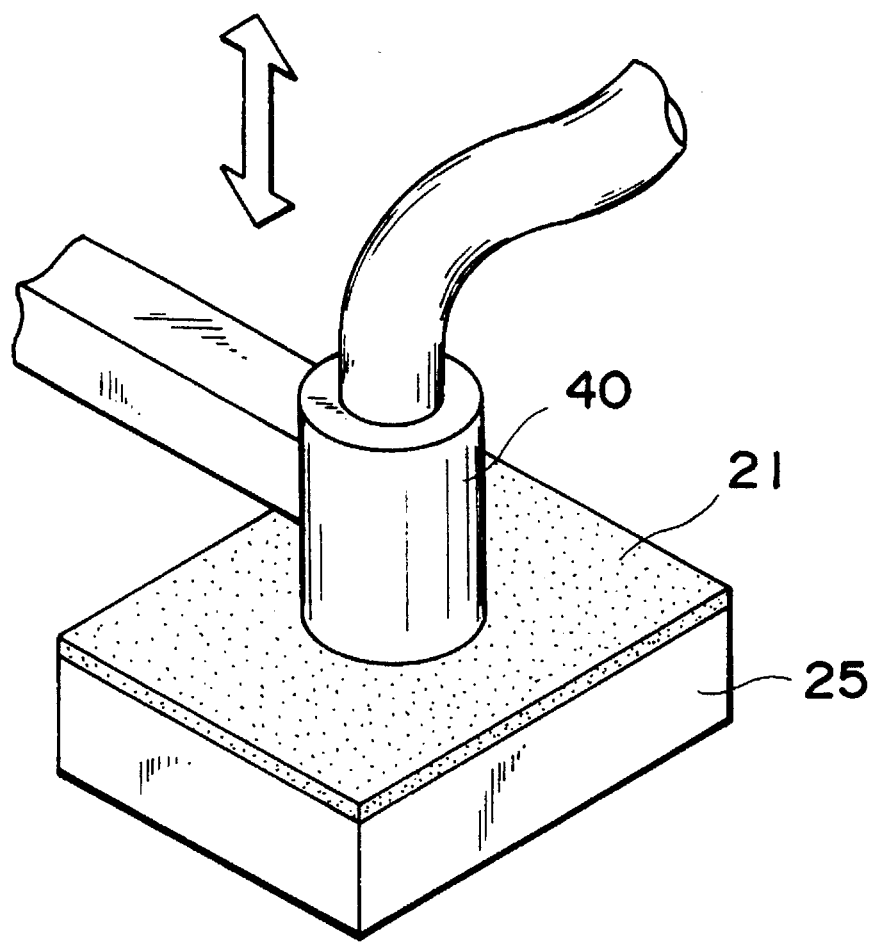
FIG. 7 is a perspective view showing a state wherein a chip 25 having a resist 21 shown in FIG. 6C is being picked up by using a collet 40. In the die bonding step, since the resist (protective coat) 21 is coated, wiring layers 90 to 92 of FIG. 10 will not be destroyed.

A flat collet 40 as shown in FIG. 7 is attached to the automatic die bonding unit (not shown). Each chip 25 is picked up by bringing the flat collet 40 into contact with its surface. Since the resist 21 is coated on the surface of the chip 25, the resist 21 serves as a protection film, and the flat collet 40 and the wiring layers 90 to 92 (shown in FIG. 10) formed on the chip 25 are not brought into direct contact with each other. Thus, the wiring layers 90 to 92 will not be damaged.

Figure 8:
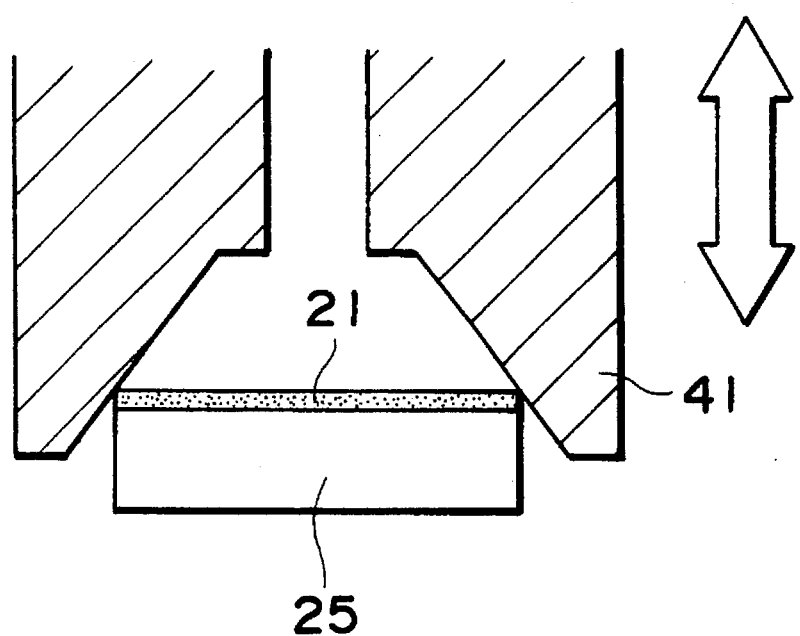
FIG. 8 is a sectional view showing a state wherein a chip 25 is being picked up by using a pyramidal collet 41. A resist 21 protects the edges of the chip 25.

In the manufacturing method (described with reference to FIGS. 1 to 4) of mounting the chip 114 in the package 119 after removing the resist 111, in the die bonding step 104 (see FIG. 2F), the chip 114 is picked up by using a pyramidal collet 41 as shown in FIG. 8. In the die bonding step 104 described with reference to FIG. 2F, if the pyramidal collet 41 is used, the collet 41 and the surface of the chip 114 are not brought into direct contact with each other, so that the wiring layers 90 to 92 (see FIG. 10) on the chip 114 can be prevented from being damaged.

However, since the pyramidal collet 41 cannot be used for chips having different sizes, separate pyramidal collets 41 are required for the respective chips, and the chip edge may be partially broken. In addition, the wiring layers and the wafer may be undesirably destroyed, as has been described with reference to FIG. 4. Therefore, it is preferable to use the flat collet 40 rather than the pyramidal collet 41. However, the flat collet 40 cannot be used for a chip having a high necessity for surface protection because, e.g., air-bridge wiring layers are formed on it. In this embodiment, even when the chip 25 is to be mounted in the package 27 (see FIG. 6C), since the resist 21 on the surface of the chip 25 serves as a protection film, the flat collet 40 can be used. Also, as shown in FIG. 8, even when the pyramidal collet 41 is used in this embodiment, since the resist 21 serves as a protection film, in the same manner as in a case wherein the flat collet 40 is used, the chip edge can be prevented from being partially broken. Furthermore, since the resist 21 is coated on the semiconductor wafer 20, when the chip 25 is to be mounted in the package 27 (see FIG. 6C), a stress which acts on the chip 25 is reduced by the resist 21, so that the chip 25 will not be destroyed.

Figure 6D:
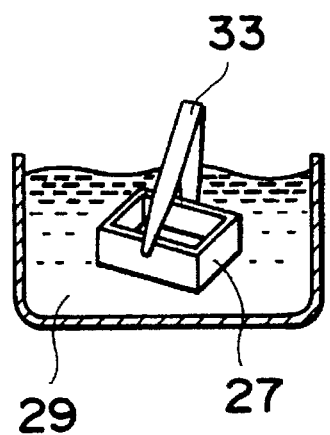
Figure 6E:
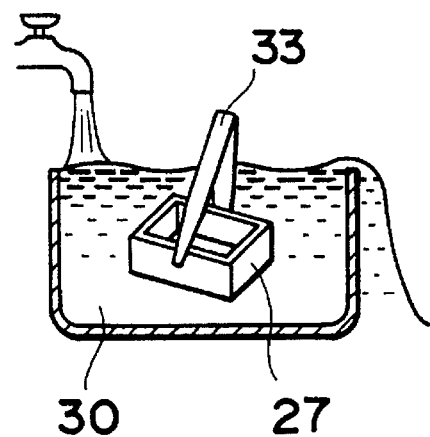

Subsequently, the resist removing step 13 and the drying step 14 are performed. In the resist removing step 13, as shown in FIG. 6D, the package 27 is dipped in a solvent 29, e.g., acetone or a resist remover, thereby removing the resist 21 on the chips 25 and 26. If the solvent 29 is heated, the resist 21 can be easily removed. After the resist 21 is removed, as shown in FIG. 6E, the package 27 is dipped in flowing deionized water 30, thereby washing away the solvent 29 attaching to the package 27.

Figure 6F:
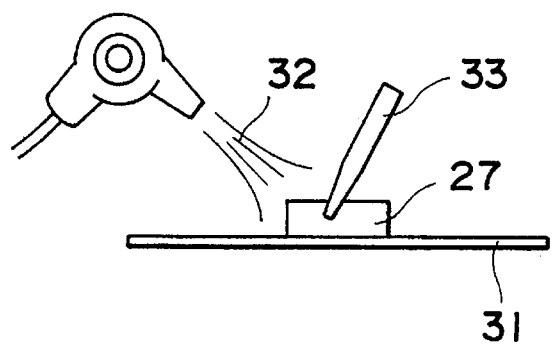

In the drying step 14, as shown in FIG. 6F, the package 27 cleaned with the flowing deionized water 30 is placed on filter paper 31, and air 32 is blown off to the package 27, thereby drying the package 27.

However, since water tends to remain on the inner surface of the package 27 and the air 32 cannot easily reach the inner surface of the package 27, it is not easy to dry the whole portion of the package 27. Hence, this drying step is preferably performed in a vacuum by heating. This is because if the package 27 is heated in a vacuum, the water content attached to the package 27 easily turns into water vapor. Heating in a vacuum is better also in the following respect. Namely, when the package 27 is heated in a vacuum, the water vapor pressure is lowered, so that the residual resist attached to the chips 25 and 26 can be scattered away.

As described above, in the resist removing step 13 and the drying step 14, since the chips 25 and 26 are already fixed to the package 27, the package 27 can be nipped with a pair of tweezers 33, and the chips 25 and 26 need not be directly nipped with the tweezers 33. Thus, the danger of the chips 25 and 26 to be partially broken is largely decreased.

Figure 6G:
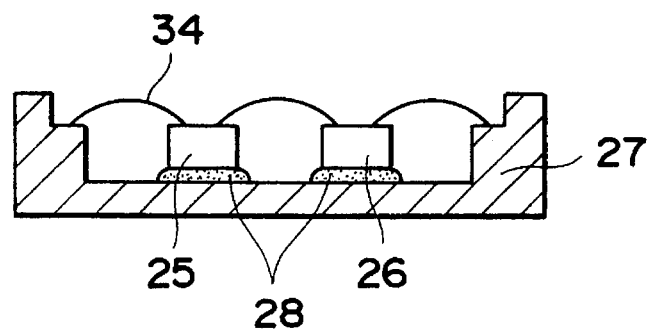

Subsequently, the wire bonding step 15 is executed. In the wire bonding step 15, as shown in FIG. 6G, the Al electrodes on the chips 25 and 26 and the leads of the package 27 are connected with metal wires 34 made of Au or Al. In this embodiment, since the package 27 is cleaned immediately before this wire bonding step 15, wire bonding can be performed well.

Figure 6H:
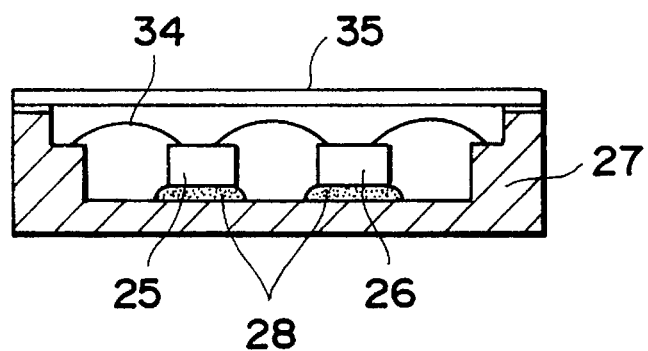

Finally, the sealing step 16 is executed. In the sealing step 16, as shown in FIG. 6H, the package 27 is hermetically sealed by covering it with a lid 35. By executing this step 16, a semiconductor device shown in FIG. 6H is completed.

Various changes and modifications may be made in the manufacturing method of this embodiment. For example, removal of the resist 21 in the resist removing step 13 may be performed by ashing in an oxygen plasma. The oxygen plasma needed for performing this method may be generated by a microwave. Furthermore, removal of the resist 21 may be performed by irradiating ultraviolet rays in an ozone atmosphere.

According to the semiconductor device manufacturing method of the present invention, the respective diced chips are mounted in the package with their upper surfaces coated with the resist. The resist formed on each chip may be removed while nipping the package with the tweezers or the like, and each chip need not be directly nipped with the tweezers. Thus, the chips will not be partially broken by chip handling, thereby improving the manufacturing yield.

Also, a pickup tool (flat collet) having versatility can be used, and the tool manufacturing cost and the time required for exchanging the tools can be decreased, so that the manufacturing cost can be decreased.

The semiconductor device manufacturing method described with reference to FIGS. 5 to 8 will be described in more detail with reference to FIGS. 9 (9A to 9J) to 25.

A method of manufacturing a semiconductor wafer having an air bridge structure will be described with reference to FIGS. 9 (9A to 9J) to 10.

Figure 9A:
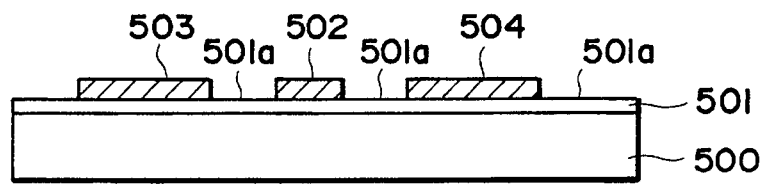
FIGS. 9A to 9J are sectional views of a semiconductor device for explaining the step of forming wiring layers constituting an air bridge structure shown in FIG. 10.

First, as shown in FIG. 9A, a first insulating film 501 made of a material, e.g., silicon nitride or silicon oxide, is formed on a semiconductor substrate 500. Subsequently, as shown in FIG. 9A, a wiring layer 502 extending perpendicularly to the surface of the sheet of the drawing and wiring layers 503 and 504 extending parallel to the surface of the sheet of the drawing are formed on the first insulating film 501.

Figure 9B:
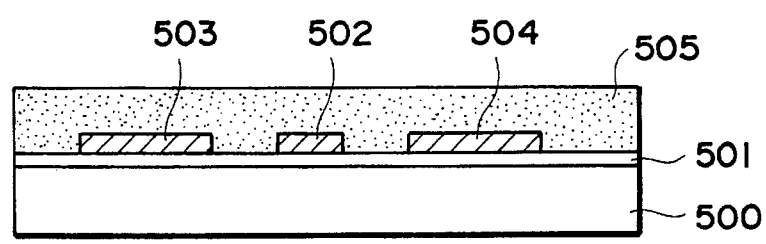
Figure 9C:
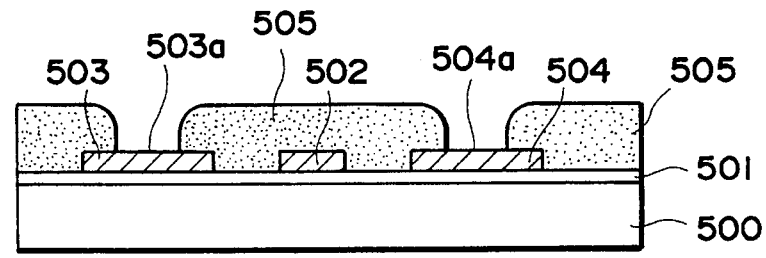

Second, as shown in FIG. 9B, a resist film 505 is coated on the first insulating film 501 and the wiring layers 502 to 504. In other words, the resist film 505 is formed on the wiring layers 502 to 504 and an exposed surface 501*a* of the first insulating film 501. Third, as shown in FIG. 9C, portions of the resist film 505 formed on regions other than on the wiring layers 503 and 504 are solidified in accordance with lithography. Subsequently, portions of the resist film 505 formed on the wiring layers 503 and 504, which are less solidified than those formed on the above regions, are removed. Accordingly, a surface 503 *a* of the wiring layer 503 and a surface 504*a* of the wiring layer 504 are exposed.

Figure 9D:
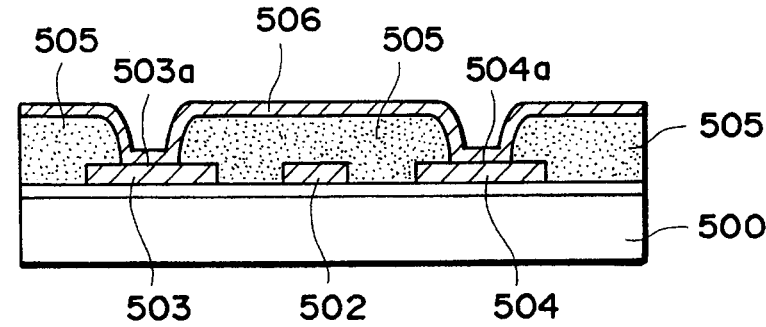

Fourth, as shown in FIG. 9D, a wiring layer 506 is formed on the resist film 505, the exposed surface 503*a* of the wiring layer 503, and the exposed surface 504*a* of the wiring layer 504. Accordingly, the wiring layer 506 forms a bridge connecting the wiring layers 503 and 504.

Figure 9E:
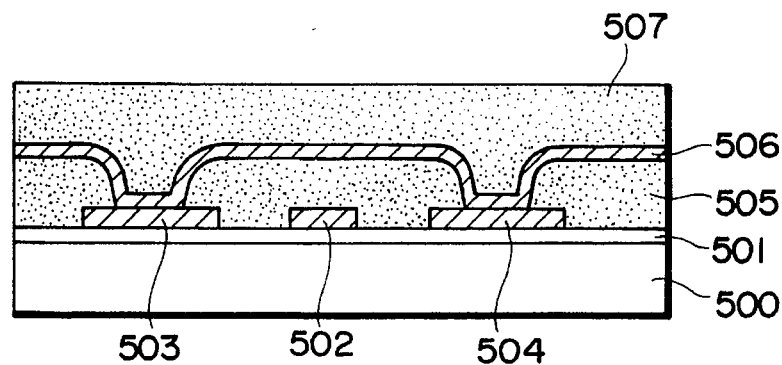

Fifth, as shown in FIG. 9E, a resist film 507 is coated on the wiring layer 506 forming the bridge.

Figure 9F:
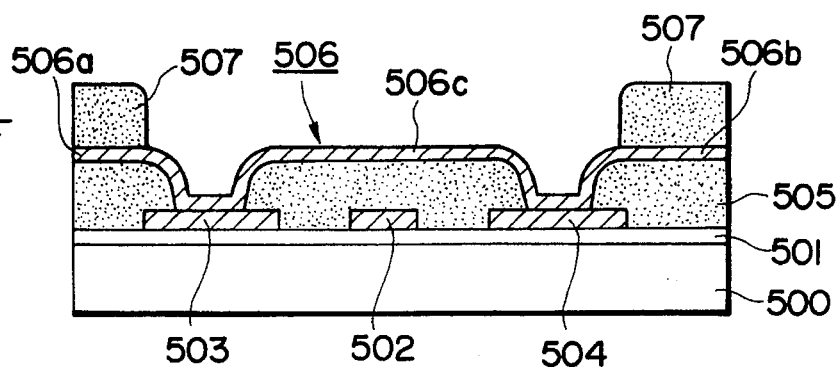

Sixth, as shown in FIG. 9F, portions of the resist film 507 formed on the surface of the portion 506*c* of the wiring layer 506 are removed in accordance with lithography. Accordingly, the surface of the portion 506*c* of the wiring layer 506 is exposed.

Figure 9G:
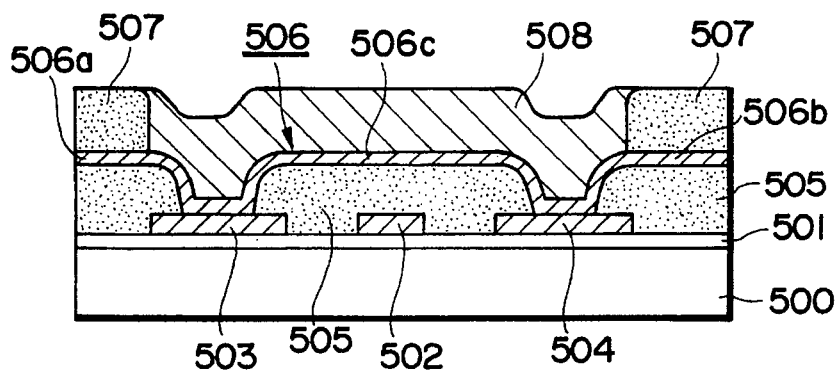

Seventh, as shown in FIG. 9G, a metal film 508 is formed on the portion 506*c* of the wiring layer 506, i.e., on the bridge. The metal film 508 is formed by plating the wiring layer 506 using gold. Since Au has lower resistivity than Al, the metal layer is made of a material containing gold to reduce the RC constant related to the metal layer 508. Accordingly, the wiring layer 506 is reinforced by the metal film 508. Alternatively, the metal film 508 may be formed by depositing a metal material on the wiring layer 506.

Figure 9H:
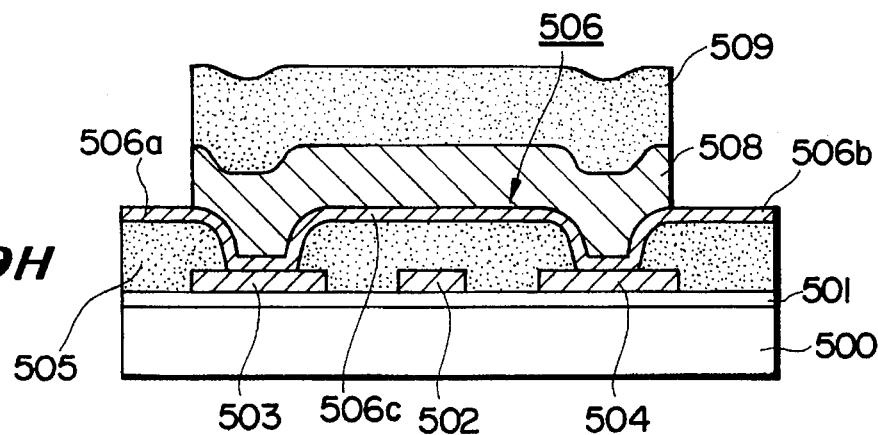
Figure 9I:
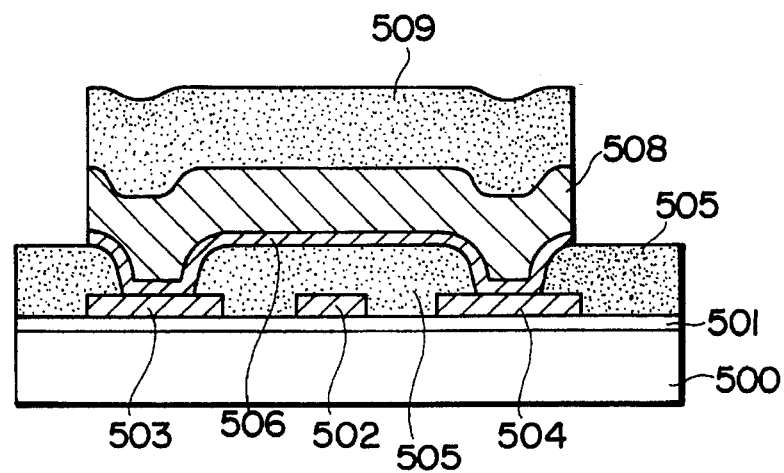

Eighth, as shown in FIG. 9H, the resist film 509 is formed on the metal film 508 for protecting the metal layer from next wiring layer removing process shown in FIG. 9I, and resist film 507 formed on the surfaces of the portions 506*a* and 506*b* are removed by using lithography technology. Then, the surface of the portions 506*a* and 506*b* of the wiring layer 506 is exposed.

Ninth, as shown in FIG. 9I, the exposed portions 506a and 506b of the wiring layer 506 are removed by anisotropic etching such as ion milling or by reactive ion etching (RIE). In this step, shown in FIG. 9I, since the protective film 509 is formed on the metal layer 508, the metal layer is protected by this etching.

Figure 9J:
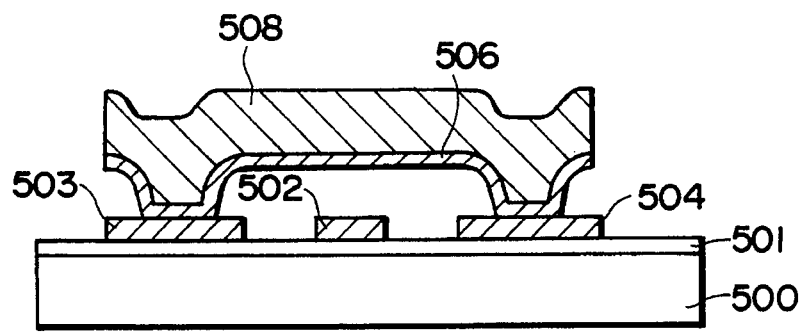

Tenth, as shown in FIG. 9J, the resist film 505 formed under and round the wiring layer 506, i.e., under and round the bridge, and the resist film 509 are removed. The resist film 505 is removed in accordance with wet etching.

When the above steps are finished, a semiconductor substrate SI on which wiring layers 90 to 92 constituting an air bridge structure shown in FIG. 10 can be obtained. The wiring structure formed by the wiring layer 506 and the metal film 508 shown in FIG. 9J corresponds to the wiring layer 91 shown in FIG. 10. The wiring layer 502 shown in FIG. 9J corresponds to the wiring layer 90 shown in FIG. 10.

Figure 25:
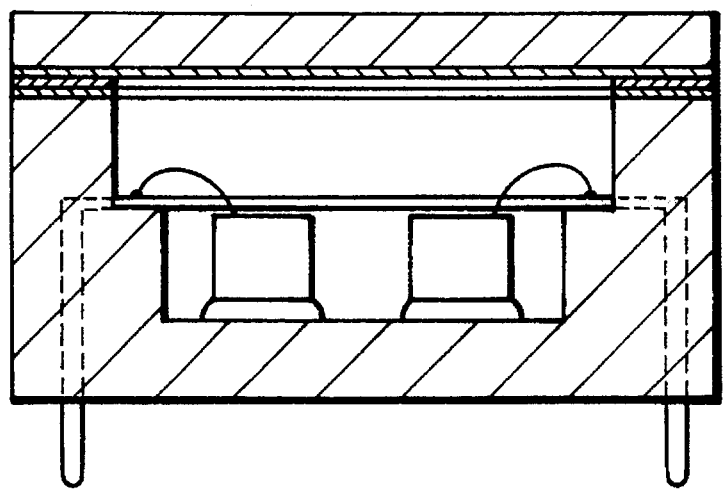
FIG. 25 is a sectional view of a completed semiconductor device.

Steps of manufacturing a device shown in FIG. 25, which is obtained by housing a semiconductor chip in a package by using a semiconductor circuit substrate PL having wiring layers 90 to 92 constituting an air bridge structure shown in FIG. 10, will be described with reference to FIGS. 11 (11A, 11A(a) and 11B) to 25.

FIGS. 11A and 11A(a) are perspective views showing a state wherein a wafer WA having wiring layers 90 and 91 constituting an air bridge structure is placed on a spinner SP. The spinner SP has a rotating member 602 in which a plurality of through holes 600 and 601 are formed. The rotating member 602 rotates about, as a rotating axis, a direction parallel to the direction of thickness of the wafer WA placed thereon. The through holes 600 and 601 are formed in the rotating member 602 in order to draw by suction the wafer WA placed on the spinner SP and to fix it on the rotating member 602.

The wafer WA has a substrate SI including a semiconductor substrate and the wiring layers 90 and 91 formed on the substrate SI. Integrated circuits IC1 and IC2 are formed in a plurality of regions on the wafer WA. A portion surrounded by a broken line in FIGS. 11A and 11A(a) is an enlarged illustration of a portion indicated by a point P. FIG. 11B is an enlarged sectional view of the wafer WA taken along the line segment Y–Y' of FIGS. 11A and 11A(a). As shown in FIG. 11B, air exists between the wiring layers 90 and 91, and the wiring layer 91 has an air bridge structure.

First, as shown in FIGS. 11A and 11A(a), the wafer WA is placed on the rotating member 602 of the spinner SP. Then, as shown in FIGS. 12A and 12A(a), while the rotating member 602 is rotated in a direction of an arrow A, a resist material RE is dropped from a nozzle NZ onto the wafer WA. Then, the resist material RE spreads on the wafer WA to have a uniform thickness by the centrifugal force generated by rotation. Accordingly, the resist material RE is uniformly coated on the wafer WA. A portion surrounded by a broken line in FIGS. 12A and 12A(a) is an enlarged illustration of a portion indicated by a point Q. FIG. 12B is an enlarged sectional view of the wafer WA taken along the line segment X–X' of FIG. 12A and 12A(a). A thickness D of the resist material RE coated on the wafer WA is larger than the height of the bridge 91, i.e., than a maximum remote distance d between the surface of the substrate SI and the wiring layer 91. After the resist material RE is coated on the wafer WA, the wafer WA having the resist material RE thereon is placed in an oven (baking furnace) (not shown). The resist material RE is baked at a temperature of 150° C. for about 15 minutes. The resist (protection film) RE is made of a material which is generally used in the manufacture of ICs. By this baking, the resist RE solidifies.

Figure 13:
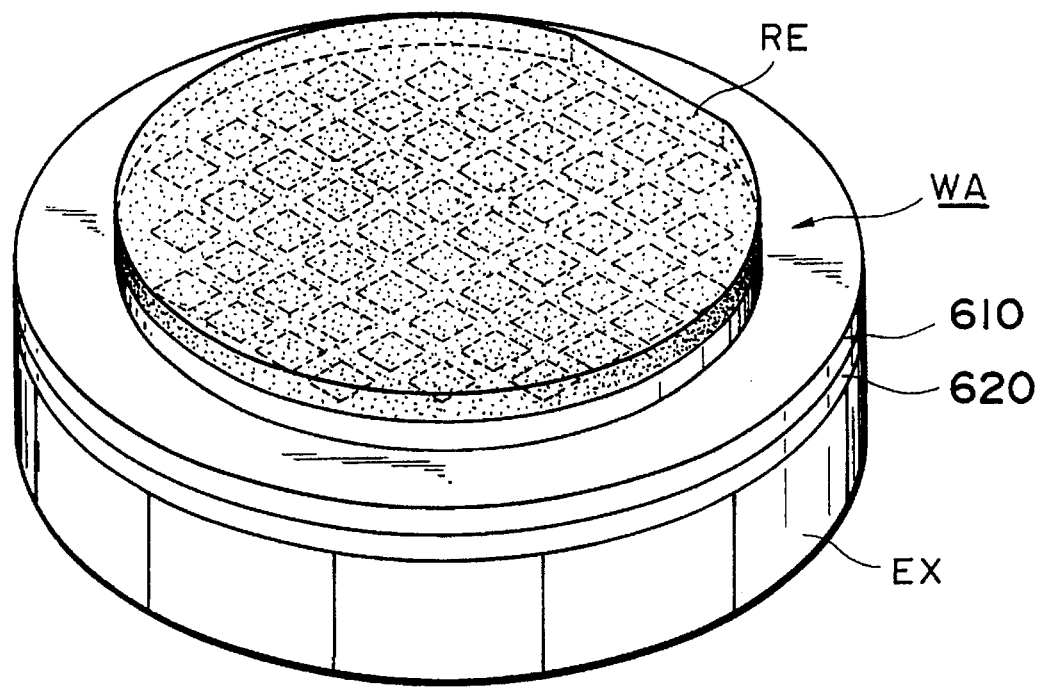
FIG. 13 is a perspective view showing a state wherein the wafer WA shown in FIG. 12B is placed on adhesive tapes 610 and 620. The resist RE is solidified by heating the wafer WA.
Figure 14:
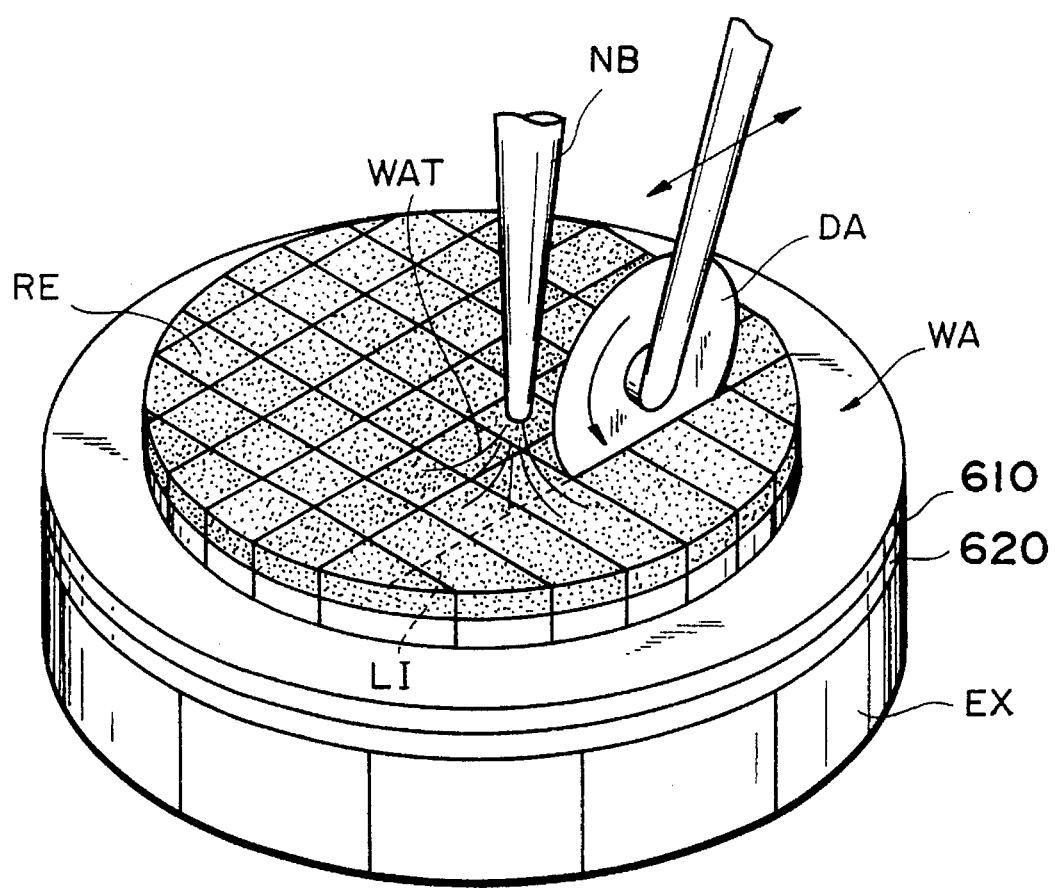
FIG. 14 is a perspective view showing a state wherein the wafer WA is diced with a diamond saw DA. Water WAT is blown off to the surface of the wafer WA. Since the surface of the wafer WA is covered with the resist RE, the wiring layers constituting the air bridge structure will not be destroyed and protected.

After the resist RE solidifies, as shown in FIG. 13, the wafer WA having the resist material RE thereon is placed on an expand ring EX. Adhesive tapes 610 and 620 are interposed between the expand ring EX and the wafer WA having the resist material RE thereon. The adhesive tapes (wafer sheets) 610 and 620 fix the wafer WA on the expand ring EX.

After the wafer WA is fixed, the wafer WA is diced along scribe lines LI formed on the wafer WA with a diamond saw (diamond blade) DA. The wafer WA is diced while blowing off a grinding water jet WAT to the wafer WA. The grinding water jet WAT is blown off to the wafer WA in order to dissipate the frictional heat generated between the wafer WA and the diamond saw DA during dicing or cutting (dividing) of the wafer WA by using the diamond saw DA and to remove cuttings formed during dicing of the wafer WA. The diamond saw DA dices the wafer WA from the surface of the wafer WA on the resist material RE side until it reaches the front surface of the adhesive tape 610.

Since the resist material RE is coated on the surface of the wafer WA, the wiring layers 90 and 91 constituting the air bridge structure of the wafer WA shown in FIGS. 11A and 11A(a) will not be damaged by blowing off the grinding water jet WAT.

Figure 15:
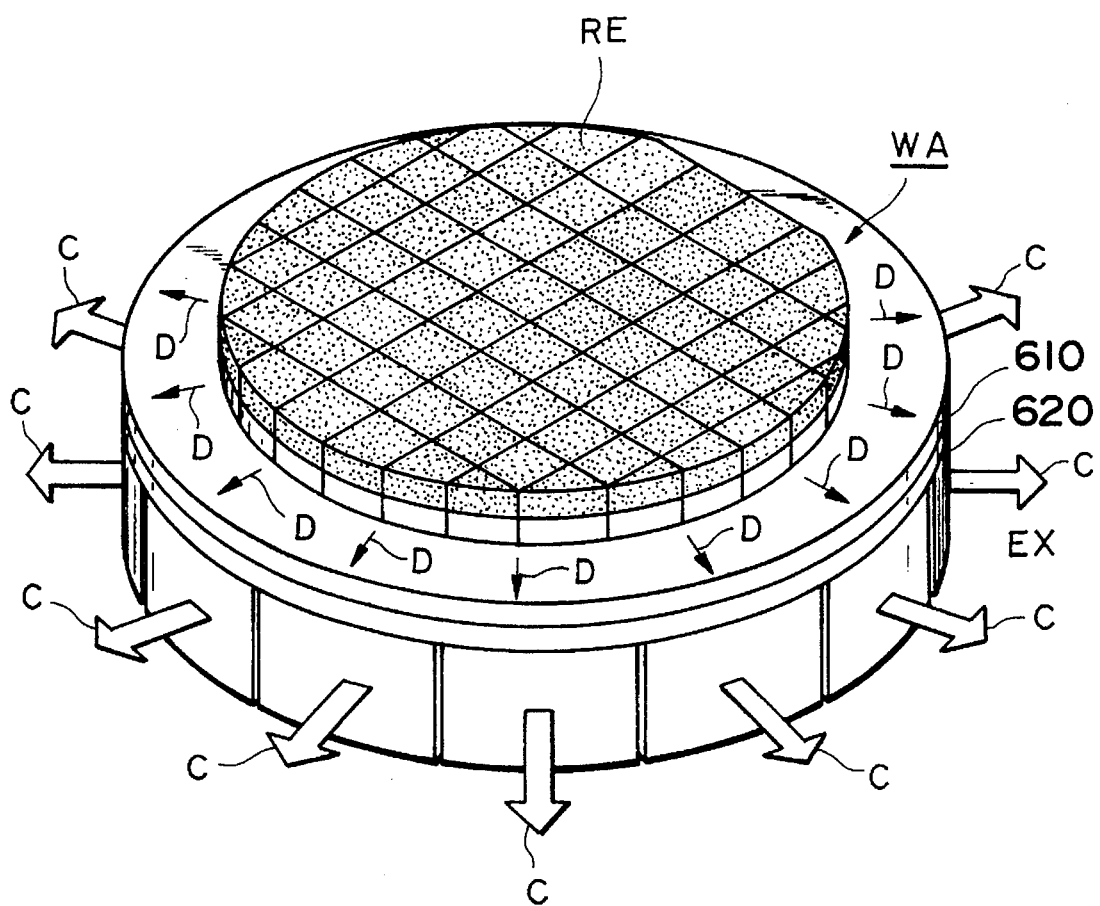
FIG. 15 is a perspective view showing a state wherein an expand ring EX is being expanded.

After this dicing operation, as shown in FIG. 15, the expand ring EX is expanded in the directions of arrows C (the radial direction of the expand ring EX). Since the expand ring EX and the wafer WA are adhered with each other through the adhesive tapes 610 and 620, the wafer WA is pulled in the directions of arrows D (the directions of the arrows C). Thus, the wafer WA is divided into a plurality of chips 700a, 700b, and 700c.

Figure 16:
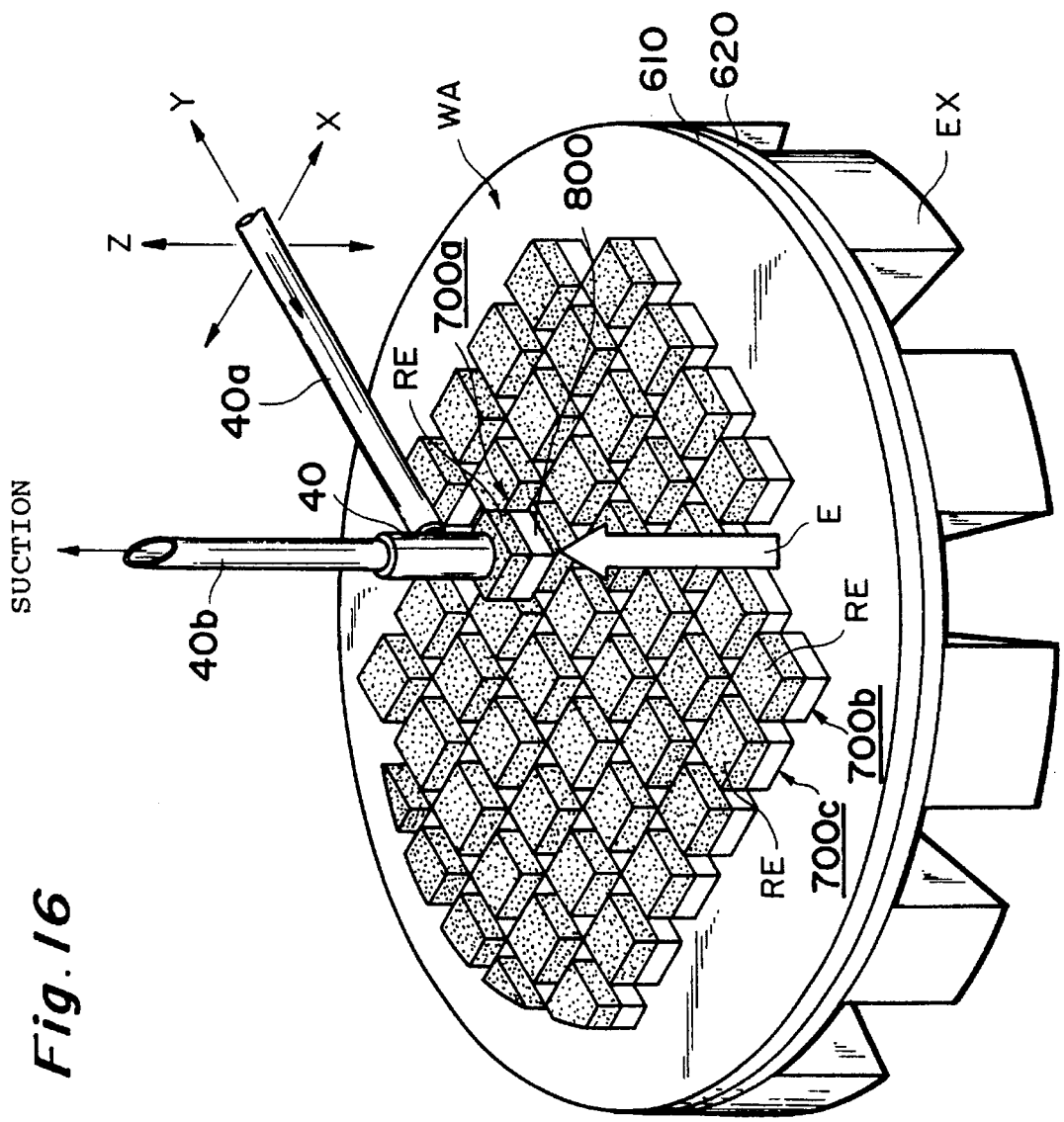
FIG. 16 is a perspective view showing a state wherein the expand ring EX has been expanded. A chip 700a is picked up by the collet 40. The surface of the chip 800 is not touched, and the air bridge formed on the surface is protected.

FIG. 16 is a perspective view showing the divided wafer WA after the expand ring EX is expanded. By expanding the expand ring EX, the chips 700a, 700b, and 700c which have resist films RE on the surfaces of substrates 800 can be obtained. The chips 700b and 700c are adhered on the adhesive tape 610 with predetermined gaps therebetween. Since the predetermined gap exists between the chips 700b and 700c, the chips 700a to 700c can be easily picked up with a collet 40. The collet 40 is identical to the collet 40 shown in FIG. 3. The collet 40 is attached with a support member 40a that supports the collet 40. The support member 40a can be moved in the X, Y, and Z directions in FIG. 16. Accordingly, the collet 40 can move in the three-dimensional space. The collet 40 communicates with a tube 40b. When air in the tube 40b is drawn by suction with a pump 40d, the pressure in the collet 40 is reduced. Thus, when the collet 40 is moved close to the chip 700a, the chip 700a is attracted by the collet 40.

Figure 17:
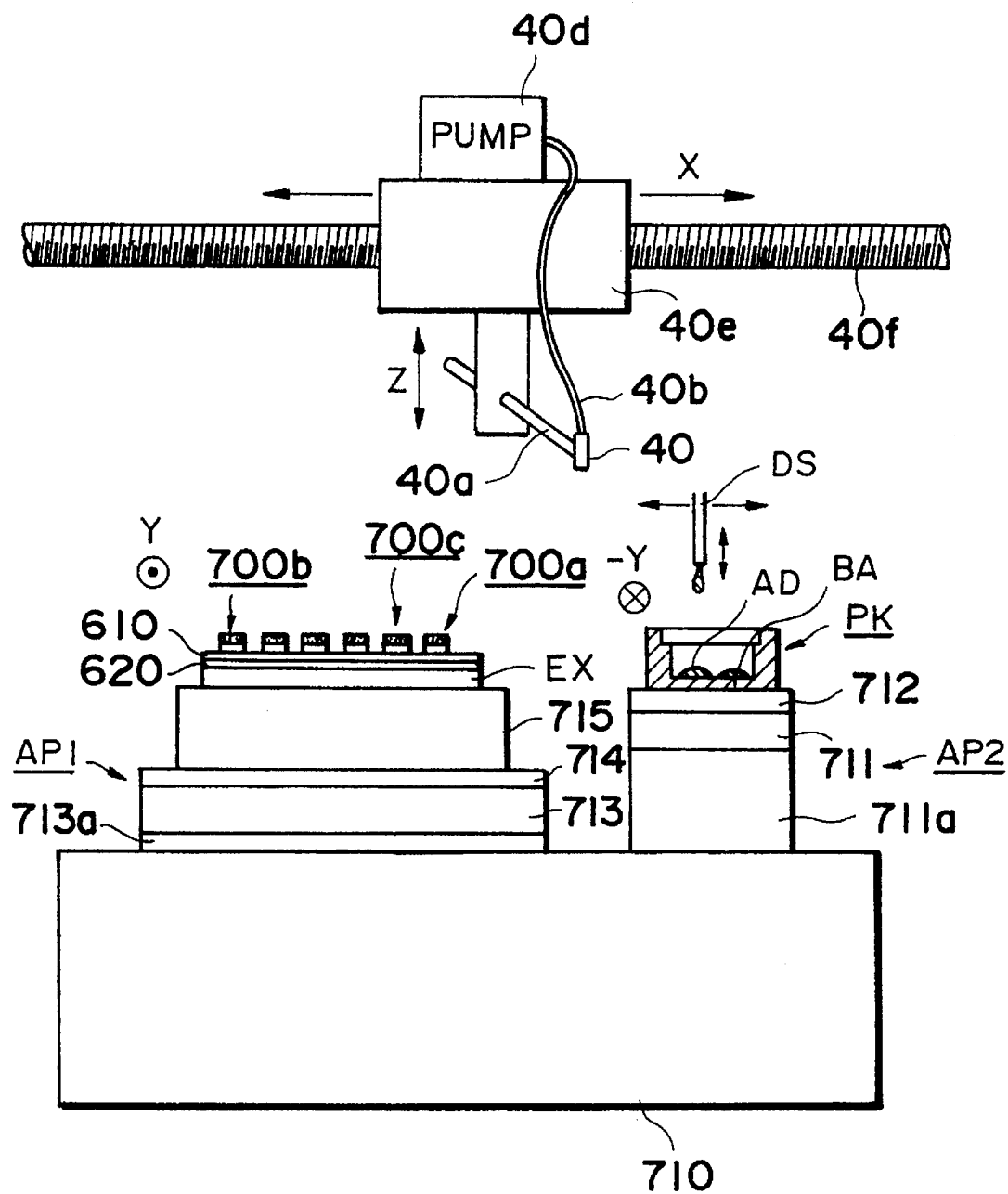
FIG. 17 is a view showing a unit for coating an adhesive AD on the inner surface of a package PK, thereby fixing the chip 700a to a inner surface of the package PK. The package include the bottom plate (base) BA having the inner surface.

FIG. 17 shows the chips 700a to 700c on the adhesive tape 610 shown in FIG. 16. FIG. 17 also shows a unit for conveying the chips. The expand ring EX is held by an expand ring holding mechanism 715. The expand ring holding mechanism 715 is arranged on a convey unit AP1. The convey unit AP1 has a roller 713, a belt 714 wound on the roller 713, and a roller holding mechanism 713a for holding the roller 713. The convey unit AP1 serves as the first belt conveyor AP1. The belt conveyor AP1 is arranged on a main body 710. A second belt conveyor AP2 is also arranged on the main body 710. The second belt conveyor AP2 has a roller 711, a belt 712 wound on the roller 711, and a roller holding mechanism 711a for holding the roller 711. A package PK having a bottom plate (base) BA is placed on the belt 712.

The first belt conveyor AP1 conveys the expand ring EX in a Y direction (a direction from the rear toward the front surface of the sheet of the drawing). The second belt conveyor AP2 conveys the expand ring EX in a −Y direction (a direction from the front toward the rear surface of the sheet of the drawing). First, while the two belt conveyors AP1 and AP2 are stopped, the die bonding step is executed.

An adhesive AD is supplied from a dispenser DS arranged above the package PK and is coated on the inner surface of the package PK at room temperature. The adhesive is an epoxy—or polyimide—based die bond resin 28. Subsequently, the chip 700a is picked up with the collet 40, conveyed into the package, and fixed on the inner surface or the lead frame of the package PK with the adhesive AD.

The support member 40a for supporting the collet 40 is mounted on a member 40c which moves in the Z direction in FIG. 16. The member 40c is mounted on a member 40e which moves in the X direction in FIG. 16. A through hole is formed in the member 40e, and a shaft 40f extends through the through hole. The support member 40a can be moved in the Y direction with respect to the member 40c. The tube 40b is connected to the pump 40d.

After the chip 700a is arranged in the package PK, the second belt conveyor AP2 is driven to move the belt 712 in the −Y direction. Then, a package PK in which a chip is not arranged comes to a place where the previous package PK has been. A chip is mounted also in this package PK. After this step, when necessary chips run out on the adhesive tape 610, the first belt conveyor AP1 is driven to move the belt 714 in the Y direction. Then, another portion of the adhesive tape 610 on which necessary chips are adhered comes to a place where the previous portion of the adhesive tape 610 has been. The semiconductor devices can be manufactured on a mass production basis by employing the moving steps of the Y and −Y directions.

Figure 19:
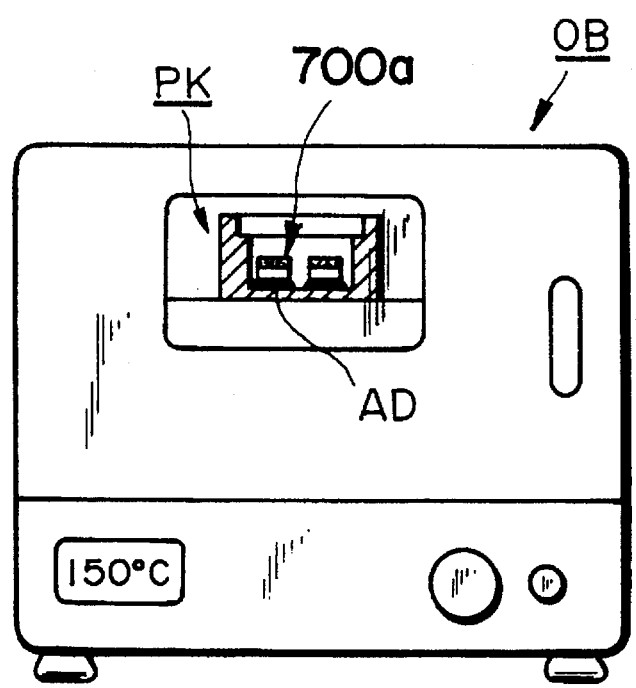

After the chip 700a is mounted in the package PK, as shown in FIG. 19, the adhesive AD is set by heating in an oven OB. The heating temperature is 150° C.

Figure 18:
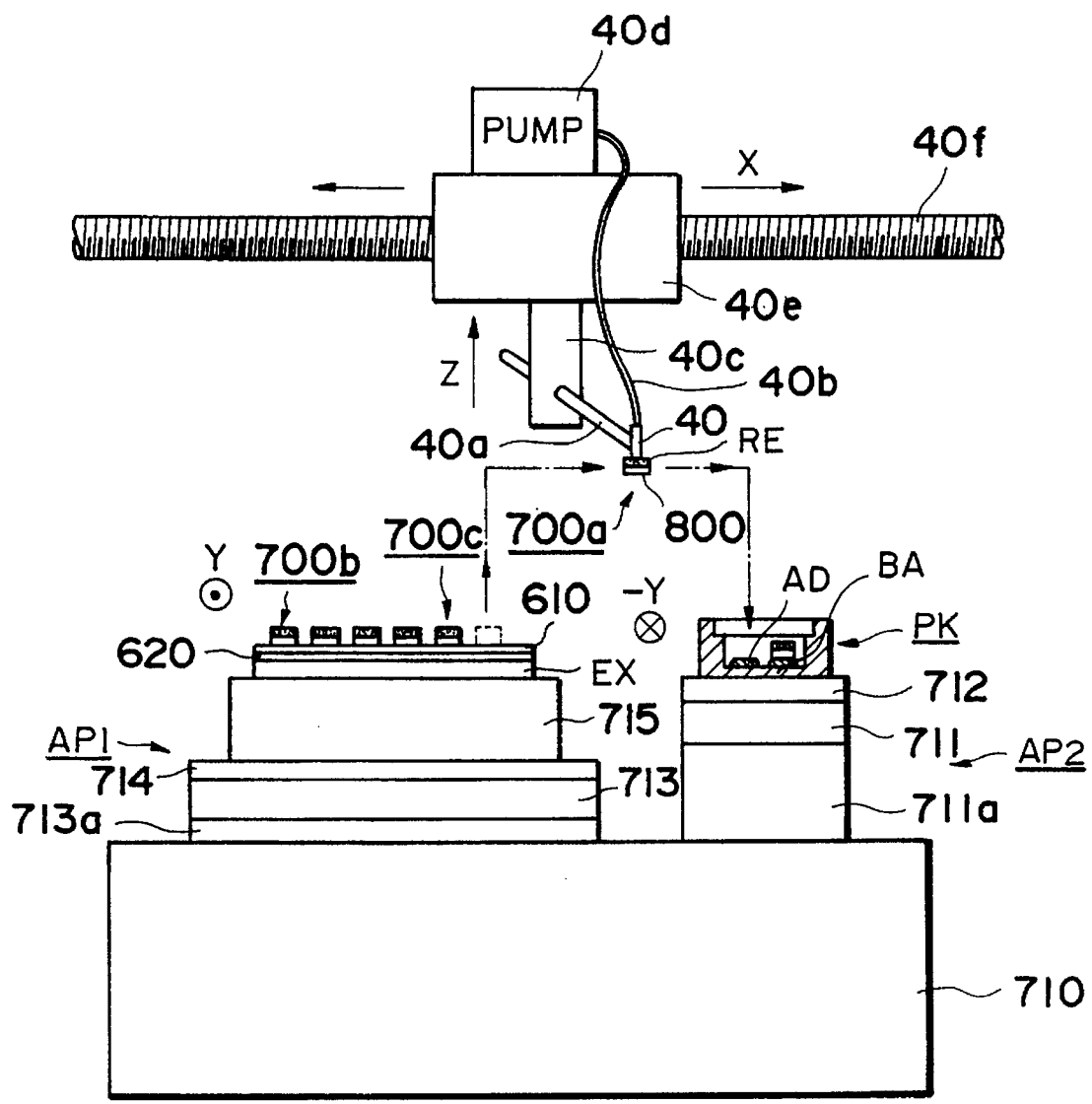
FIG. 18 is a view showing a state wherein the chip is being die-bonded in the package PK by using the unit shown in FIG. 17. The chip 700a is picked up by the collet 40 without touching the chip 800 and its surface.

A system shown in FIG. 18 has a flat collet 40. The chip 700a is picked up by bringing the flat collet 40 into contact with the surface of the chip 700a. Since the resist film RE is formed on the surface of the substrate 800, the resist film RE serves as a protection film, so that the flat collet 40 and the air bridge wiring layers 90 and 91 (shown in FIG. 12) formed on the substrate 800 are not brought into direct contact with each other. Thus, the air bridge wiring layers 90 and 91 will not be broken.

Up to this step, the chip 700a is arranged in the package PK. Thus, even if the package PK is nipped with tweezers or the like, the chip 700a in the package PK will not be damaged.

Figure 20:
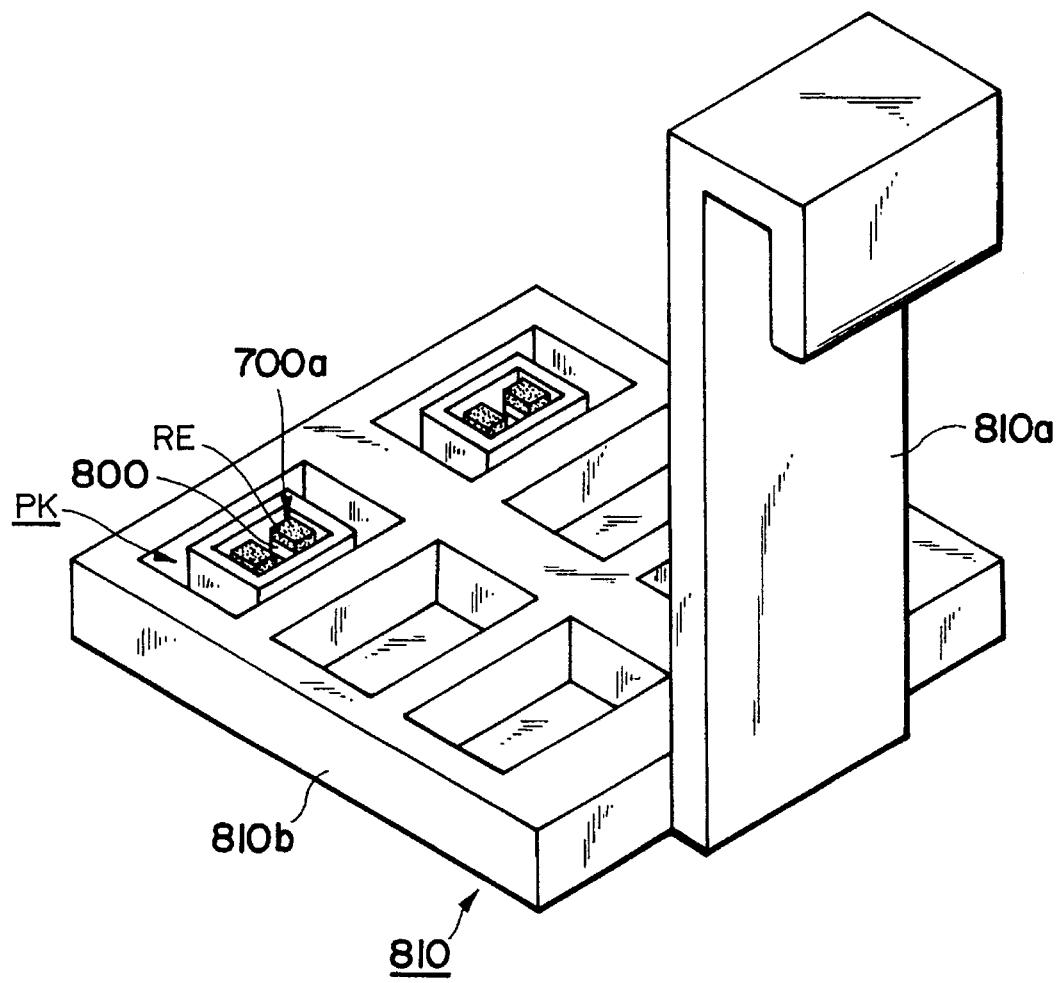
FIG. 20 is a perspective view showing a state wherein packages PK are arranged in a tray 810. In this step, each chip 700a need not be directly touched, and only the corresponding package PK need be nipped with a pair of tweezers.

Subsequently, as shown in FIG. 20, the package PK housing the chips therein is nipped with the tweezers or a robot arm and placed on a pallet 810.

Figure 21:
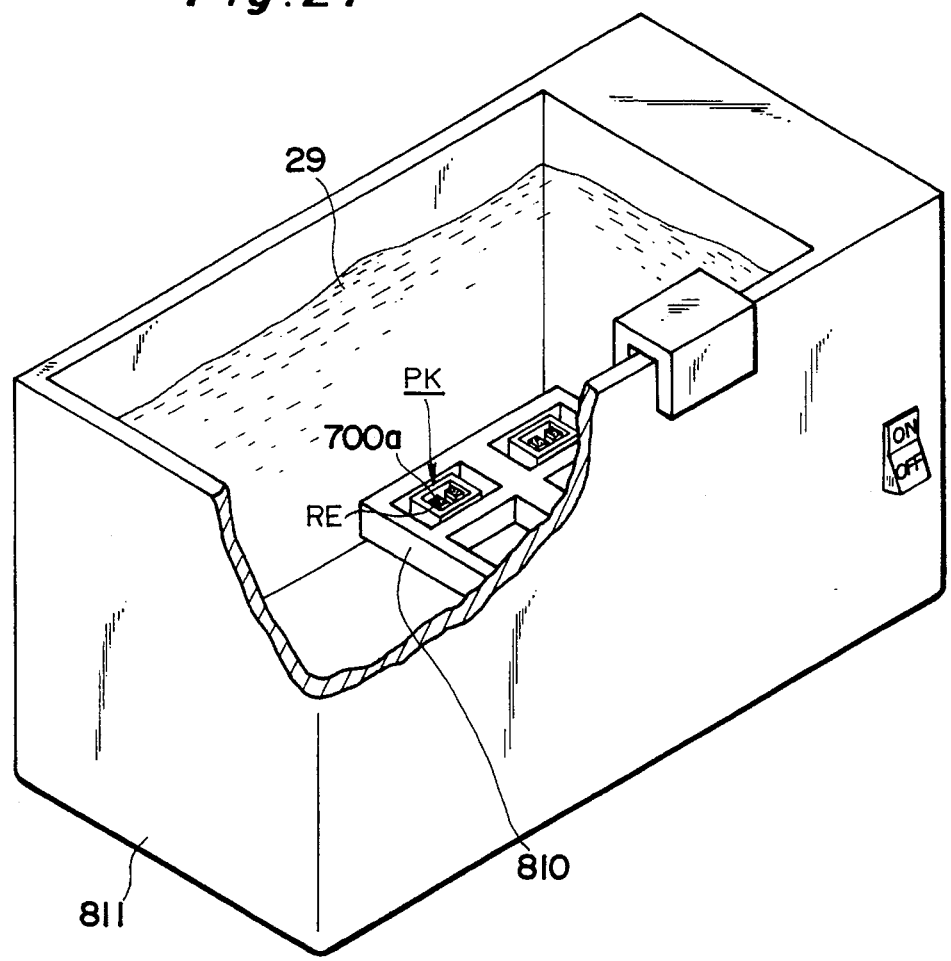
FIG. 21 is a perspective view showing a state wherein the tray 810 shown in FIG. 20 is arranged in an ultrasonic cleaning equipment 811. A solvent 29 is filled in the container 811. In this step, the resist RE is dissolved in the solvent 29 and removed from the chips 700a. The chip 700a can be derived from the removing space 29 without touching the surface of the resist-removed-chip by handling the package PK or tray 810.

Thereafter, as shown in FIG. 21, the pallet 810 in which the packages PK are placed is set in a container 811 filled with a solvent 29, e.g., acetone or a resist remover. The container 811 constitutes an ultrasonic cleaning equipment 811. When an ultrasonic wave is applied to the container 811, the resist film RE is quickly removed from each chip 700a by the vibration of the solvent 29.

Figure 22:
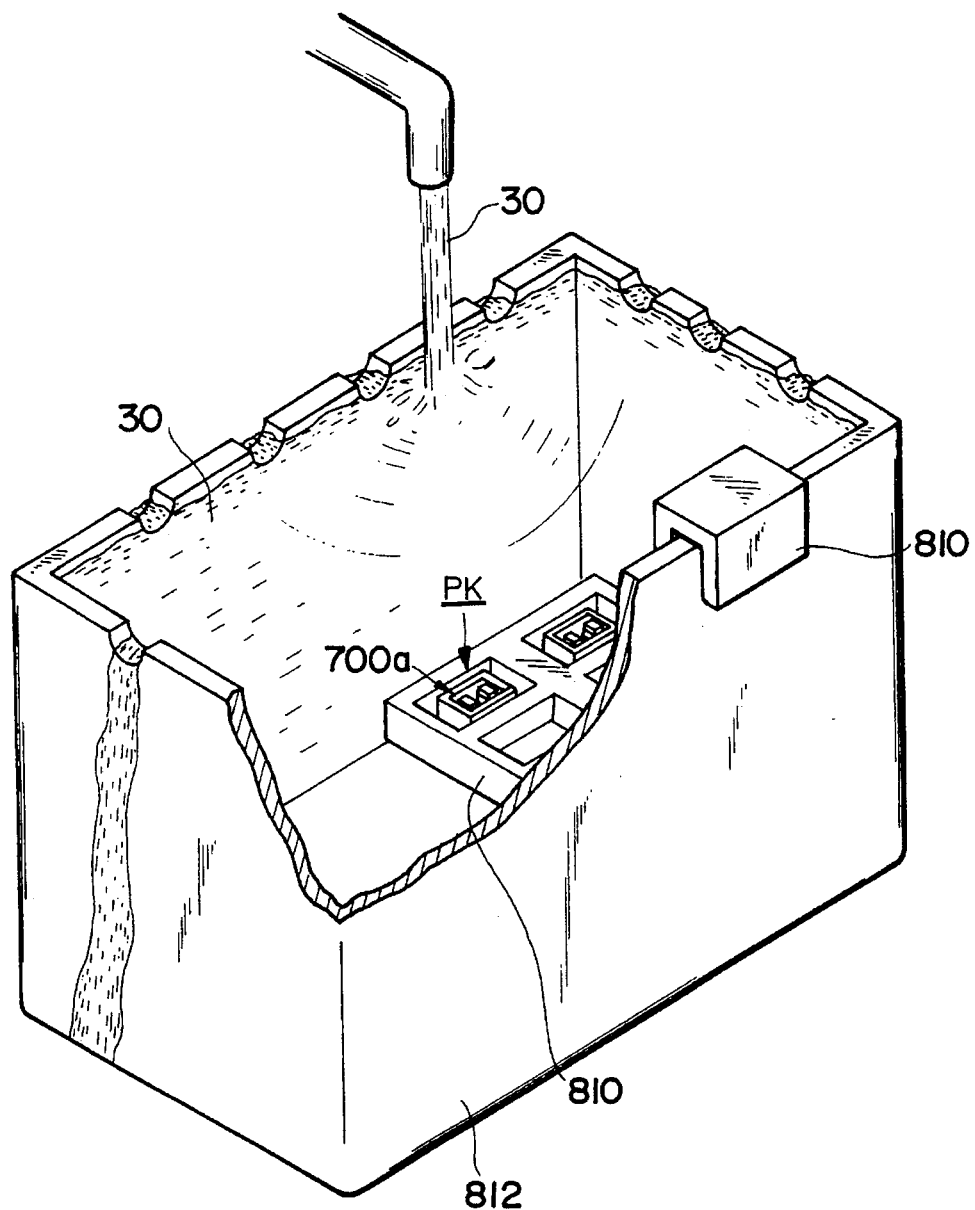
FIG. 22 is a perspective view showing a state wherein the tray 810 shown in FIG. 21 is arranged in a container 812 filled with deionized water(pure water) 30. The chips 700a are cleaned with the deionized water 30. The chip 700a can be derived from the cleaning space 30 without touching the surface of the resist-removed-chip 700a by handling the package PK or tray 810.
Figure 23:
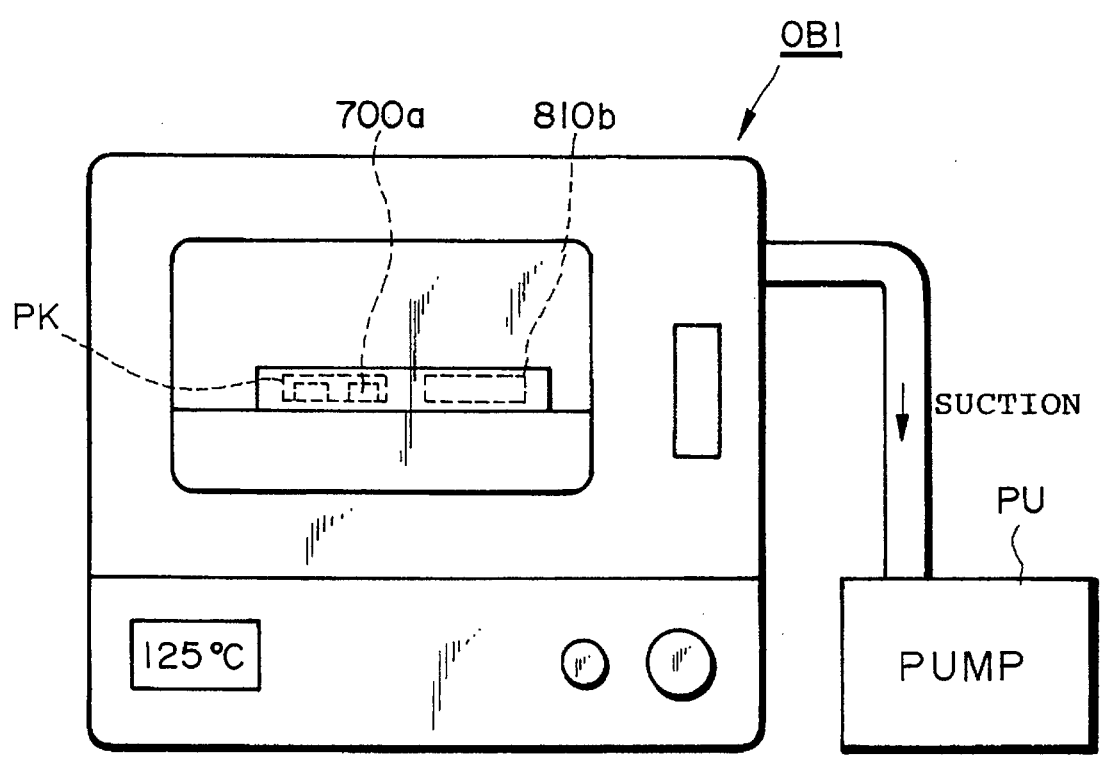
FIG. 23 is a view showing a state wherein the packages PK extracted from the water are arranged in an oven OB1. The packages PK are heated in a vacuum (low pressure). Thus, the packages PK are quickly dried. The chip 700a is carried from the vessel 812 shown in FIG. 22 into the oven OB1 by handling the tray 810b.

After the resist film RE is removed, the pallet 810 is set as shown in FIG. 22, and the packages PK are dipped in deionized water 30 filled in a container 812. The packages PK are rinsed with the deionized water 30, and the solvent 29 attached to the packages PK and the chips 700a is removed.

Thereafter, the pallet 810 is extracted from the container 812. Water fills the package PK at this point. In the drying step, this water is removed. A hook portion 810a of the pallet 810 shown in FIG. 20 can be removed from a base tray 810b of the pallet 810. The hook portion 810a is removed from the base tray 810b, and the base 810b on which the packages PK are placed is set in an oven OB1. The oven OB1 is connected to a pump PU. When air in the oven OB1 is drawn by suction by using the pump, the interior of the oven OB1 is set at a pressure (a vacuum of about 100 Torr) lower than the atmospheric pressure. The temperature in the oven is set at 125° C. Thus, the packages PK are heated in a vacuum. In this step, since the packages PK are heated in a vacuum, the water content attached to the packages PK easily turns into water vapor. When the packages PK are heated in a vacuum, the water vapor pressure is lowered, so that the residue of the resist film RE attached to the chips 700a can be scattered away.

Figure 24:
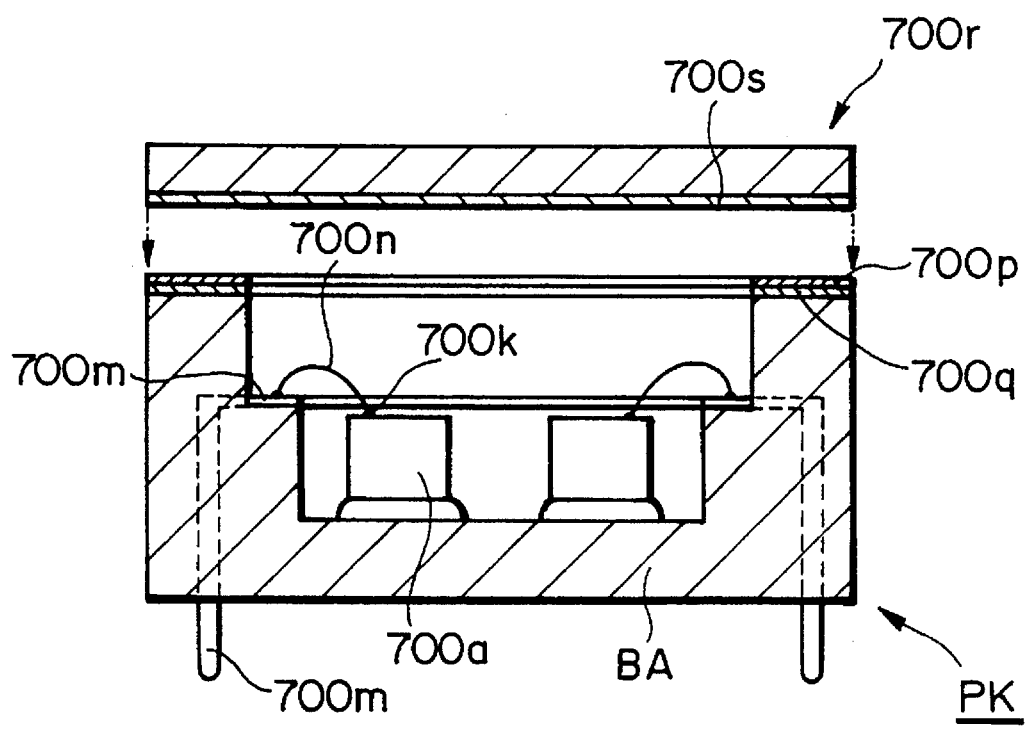
FIG. 24 is a sectional view of a package PK that shows a state wherein the chips 700a and a lead 700m are connected by using wires 700n and the package PK is sealed with a lid 700r. The chip 700a has already mounted on and fixed to the base BA.

The wire bonding step is executed. In the wire bonding step, as shown in FIG. 24, A1 electrodes 700k on the chips 700a and leads 700m of each package PK are connected to each other through metal wires 700n made of, e.g., Au or A1. In this embodiment, since the package PK is cleaned immediately before this wire bonding step, dust attached to the leads 700m of the package PK has been removed. Thus, the wiring layers 700n and the leads 700m can be connected to provide high electric characteristics.

The package PK is to be covered with a lid 700r. An Ni film 700p and a gold film 700q are plated on the open end faces of the package PK. A Au-Sn eutectic alloy 700s is formed on one surface of the lid 700r. The lid 700r is brought into contact with the package PK so that the gold film 700q contacts the eutectic alloy 700s. When the eutectic alloy 700s is heated, the alloy 700s and the films 700p and 700q melt to seal the package PK with the lid 700r. FIG. 25 shows a completed semiconductor device.

Another embodiment of the present invention will be described with reference to FIGS. 26 and 27 (27A to 27I).

Figure 26:
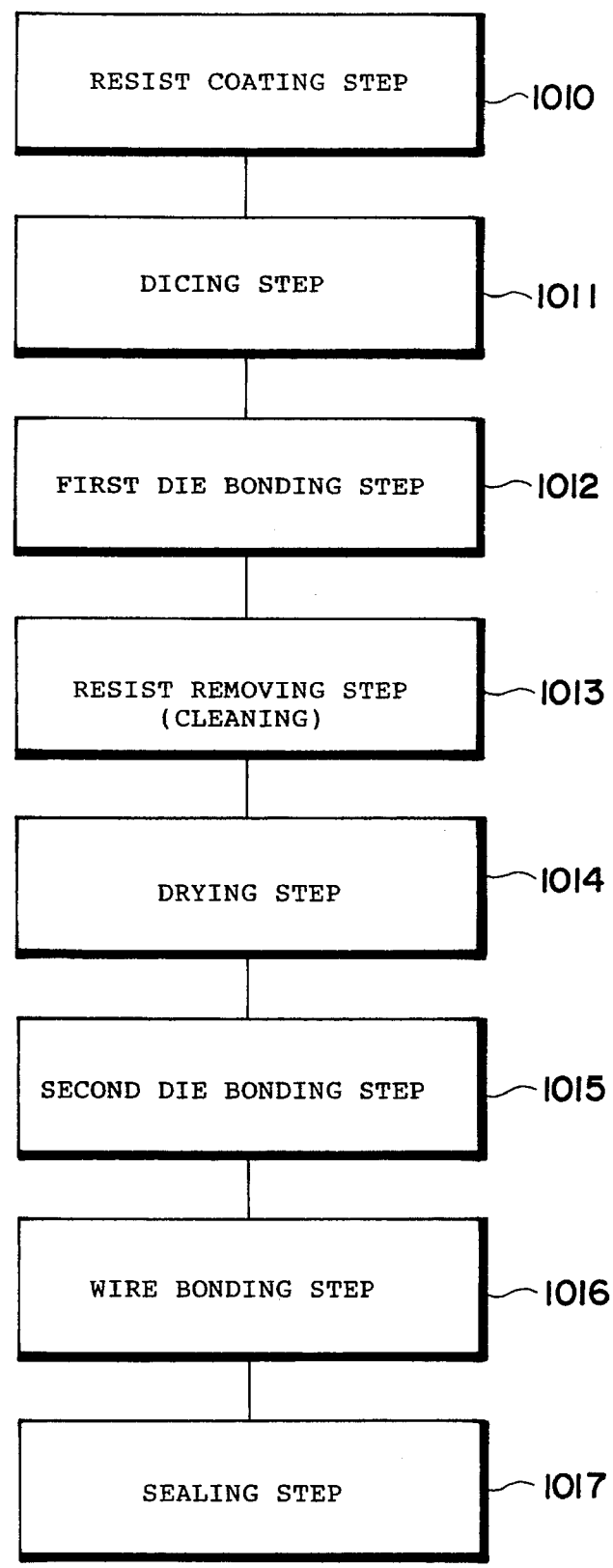
FIG. 26 is a flow chart showing a method of manufacturing a semiconductor device according to another embodiment of the present invention.

FIG. 26 is a flow chart showing the steps of a semiconductor device manufacturing method according to this embodiment. As shown in FIG. 26, the semiconductor device manufacturing method of this method includes a resist coating step 1010, a dicing step 1011, a first die bonding step 1012, a resist removing step 1013, a drying step 1014, a second die bonding step 1015, a wire bonding step 1016, and a sealing step 1017.

Figure 27A:
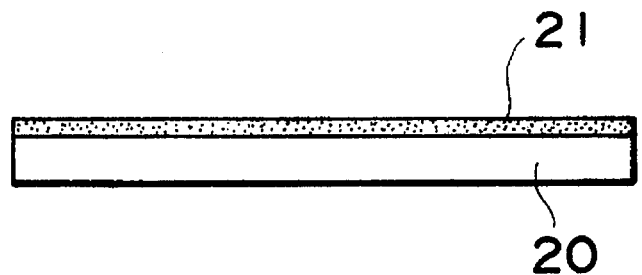
FIGS. 27A to 27I are views showing the method of manufacturing a semiconductor device according to the embodiment shown in FIG. 26 in accordance with the flow chart shown in FIG. 26.
Figure 27B:
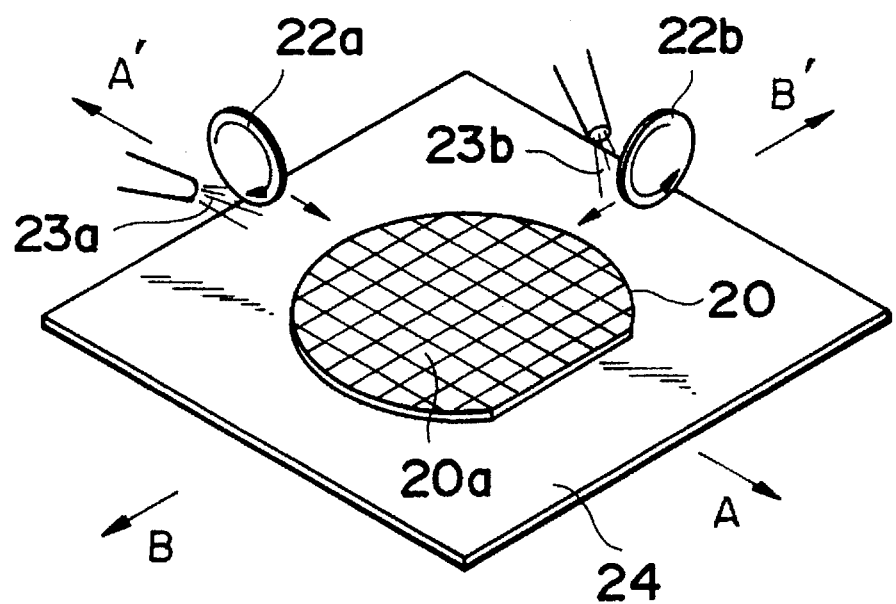
Figure 27C:
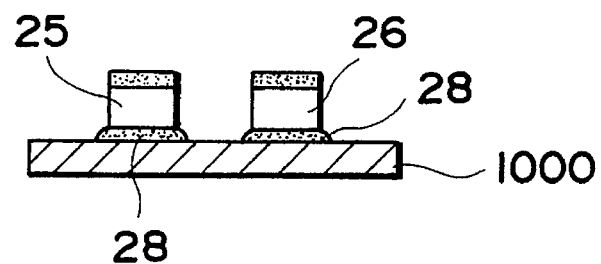
Figure 27D:
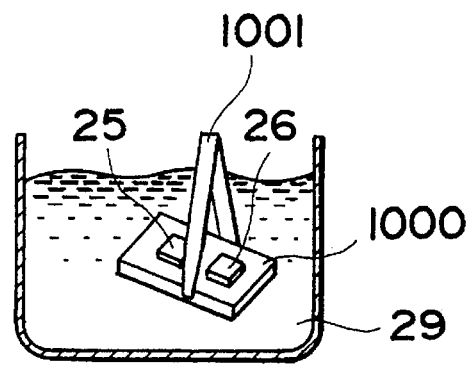
Figure 27E:
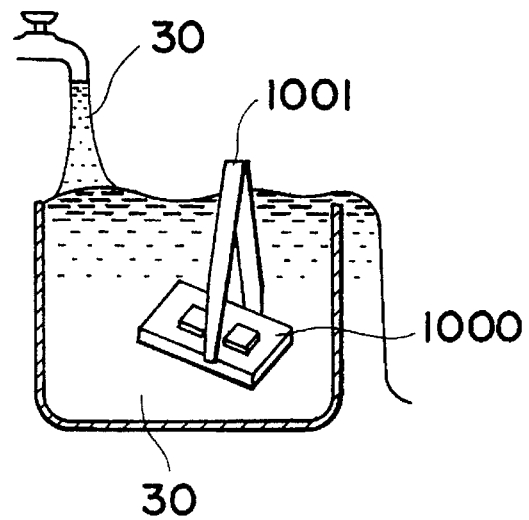
Figure 27F:
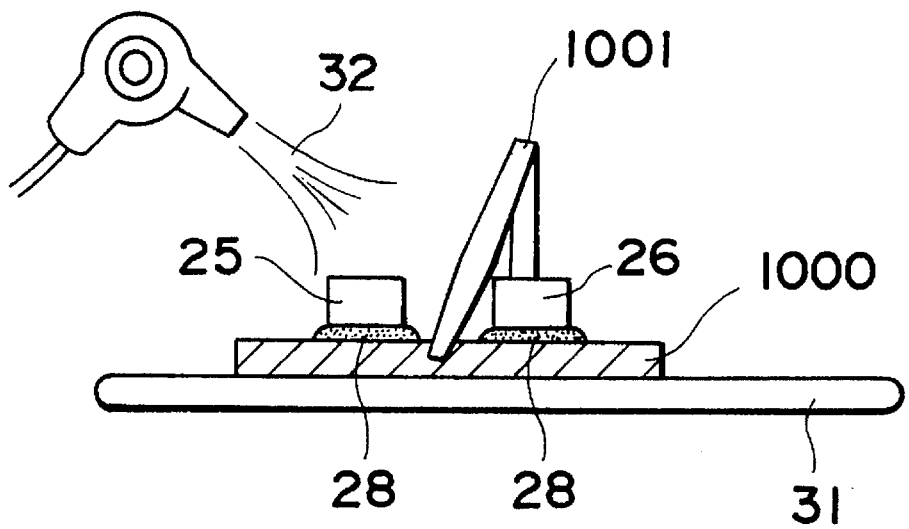
Figure 27G:
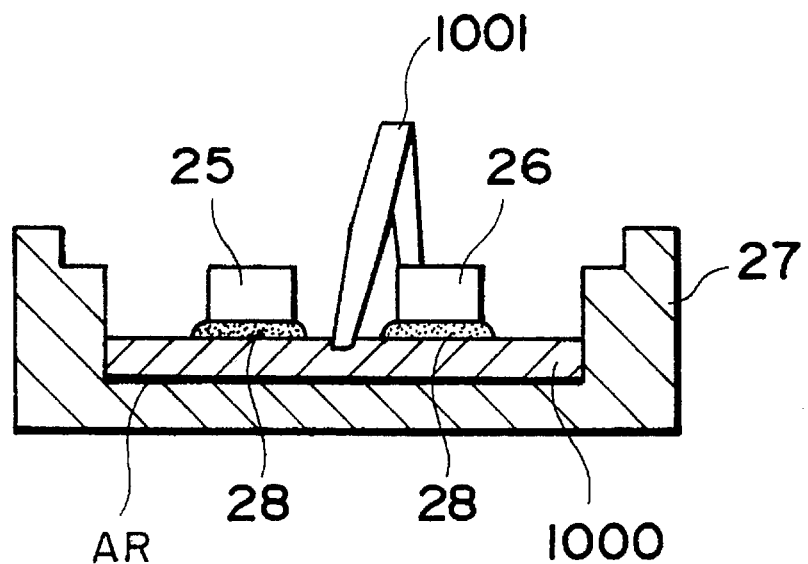
Figure 27H:
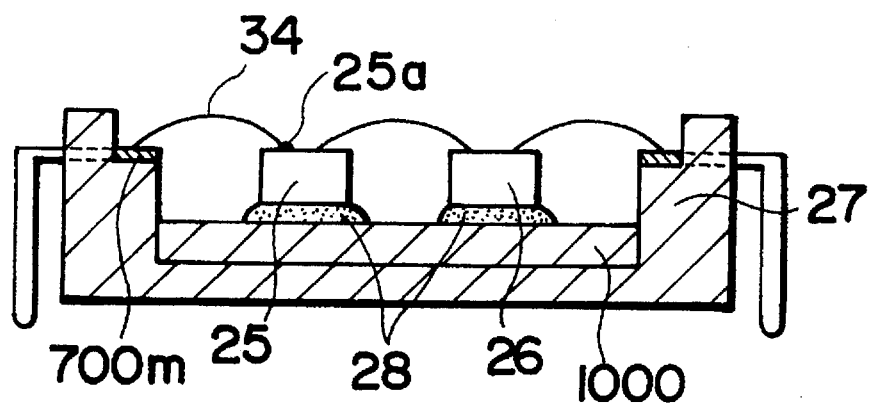
Figure 27I:
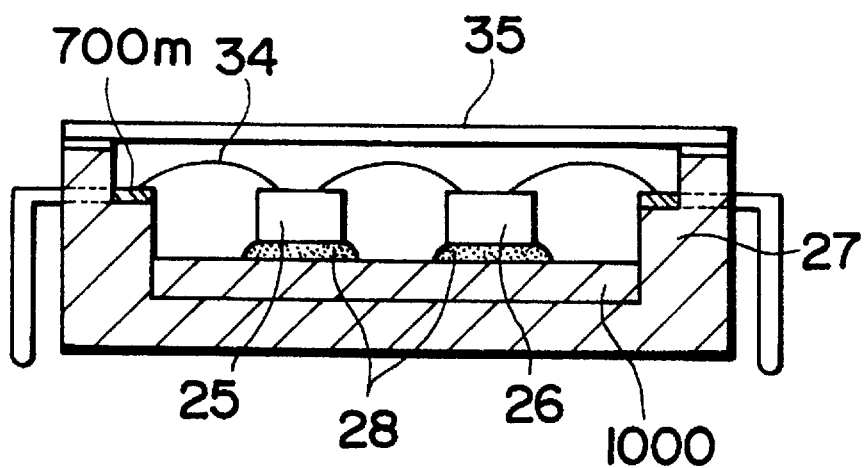

A semiconductor device shown in FIG. 27I can be completed by executing these steps 1010 to 1017.

Note that these steps 1010 to 1017 are executed in this order.

First, a semiconductor wafer 20 including a semiconductor substrate SI shown in FIG. 10, on which wiring layers 90 to 92 having an air bridge structure are formed, is prepared. After this preparation, the following steps 1010 to 1017 shown in FIGS. 27A to 27I are executed.

In the resist coating step 1010, as shown in FIG. 27A, a resist 21 is coated on a surface (a surface on which an air bridge structure is formed) of the semiconductor wafer 20 on which an air bridge wiring structure has been formed. This step 1010 is identical to the step described with reference to FIG. 6A and FIGS. 11A to 13.

In the dicing step 1011, as shown in FIG. 27B, the semiconductor wafer 20 is adhered on the adhesion surface of a dicing tape 24 and fixed to a dicing unit (not shown). After fixing, grooves are formed in the semiconductor wafer 20 along scribe lines 20a formed on the semiconductor wafer 20 with diamond saws 22a and 22b while flowing grinding water jets 23a and 23b. Since the resist 21 is coated on the semiconductor wafer 20, the wiring layers 90 to 92 constituting the air bridge structure shown in FIG. 10 will not be damaged by blowing off the grinding water jets 23a and 23b. Subsequently, the semiconductor wafer 20 is cleaved along the scribe lines 20a by rolling the roller (not shown) on the semiconductor wafer 20 formed with the grooves. After this cleaving operation, the dicing tape 24 is pulled in A–A' and B–B' directions, as shown in FIG. 27B, thereby dividing the semiconductor wafer 20 into individual chips 25. This step is identical to the step described with reference to FIG. 6B and FIGS. 14 to 16.

Then, the first die bonding step 1012 is executed. In the first die bonding step 1012, as shown in FIG. 27C, the divided chips 25 and 26 are mounted on a plate 1000. This mounting is performed with the collet 40 shown in FIG. 18. In the mounting operation, the chips 25 and 26 are adhered on the base 1000 at normal temperature by using an epoxy— or polyimide-based die bond resin 28, and the die bond resin 28 is set by heat in the oven shown in FIG. 19. The flat collet 40 picks up each chip 25 by contacting the surface of the chip 25. Since the resist 21 is coated on the surface of the chip 25, the resist 21 serves as a protection film, so that the flat collet 40 and air bridge wiring layers 90 to 92 (shown in FIG. 10) formed on the chip 25 are not brought into direct contact with each other. Thus, the air bridge wiring layers 90 to 92 will not be damaged.

Subsequently, the resist removing step 1013 and the drying step 1014 will be performed. In the resist removing step 1013, as shown in FIG. 27D, the plate 1000 is dipped in a solvent 29, e.g., acetone or a resist remover, thereby removing the resist 21 on the chips 25 and 26. If the solvent 29 is heated, the resist 21 can be easily removed. After the resist 21 is removed, as shown in FIG. 27E, the plate 1000 is dipped in deionized water 30, thereby washing away the solvent 29 attached to the plate 1000. Note that the plate 1000 is nipped with a pair of tweezers 1001.

In the drying step 1014, as shown in FIG. 27F, the plate 1000 cleaned with the deionized water 30 is placed on filter paper 31, and air 32 is blown off to the plate 1000, thereby drying the plate 1000. This drying step 1014 is preferably identical to the step described with reference to FIG. 23.

As described above, in the resist removing step 1013 and the drying step 1014, since the chips 25 and 26 are already fixed to the plate 1000, the plate 1000 can be nipped with the pair of tweezers 1001, and the chips 25 and 26 need not be directly nipped with the tweezers 1001. Thus, the danger of the chips 25 and 26 to be partially broken is largely decreased.

Subsequently, the second wire bonding step 1015 is executed. In the second wire bonding step 1015, as shown in FIG. 27G, the plate 1000 is fixed in a package 27. The plate 1000 is fixed on the inner surface of the package 27 by using an adhesive AD.

Then, the wire bonding step 1016 is executed. The wire bonding step 1016 is identical to the step described with reference to FIGS. 6G and 24. In the wire bonding step 1016, as shown in FIG. 27H, Al electrodes 25a on the chips 25 and 26 and leads 700m of the package 27 are connected to each other with metal wires 34 of, e.g., Au or Al.

Finally, the sealing step 1017 is executed. In the sealing step 1017, as shown in FIG. 27I, the package 27 is covered with a lid 35, thereby hermetically sealing the package 27. When this step 1017 is performed, the semiconductor device shown in FIG. 27I is completed. Note that the plate 1000 includes the lead frame. In the above embodiments, a semiconductor device having wiring layers constituting an air bridge structure is discussed. However, the present invention can also be applied to a semiconductor device, e.g., a CCD and a LED, which needs surface protection.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 253978 filed on Oct. 12, 1993 is hereby incorporated by reference.

What is claimed is:

1. A method for manufacturing a semiconductor device, comprising the steps of:
   (a) forming first, second, and third wiring layers on a surface of a wafer, wherein said third wiring layer is arranged between said first and said second wiring layers;
   (b) coating surfaces of said first, second, and third wiring layers and a remaining exposed surface of said wafer with a resist;
   (c) partially removing said resist to expose a part of the surfaces of said first and second wiring layers;
   (d) coating said exposed surfaces of said first and second wiring layers, and a surface of said resist, with a fourth wiring layer to connect said first wiring layer to said second wiring layer via said fourth wiring layer;
   (e) removing said resist arranged between said fourth wiring layer and said third wiring layer to form an air gap between said third and fourth wiring layers, thereby forming an air bridge structure;
   (f) forming a chip from said wafer having said air bridge structure, said chip being covered with a protective coat;
   (g) die bonding said chip having said protective coat to a package; and
   (h) removing said protective coat from said chip while keeping said chip fixed on said package.

2. A method according to claim 1, wherein said step (f) comprises the steps of:
   adhering said wafer on an adhesive tape;
   coating a surface of said wafer with said protective coat;
   dicing said wafer to form said chip, while keeping said protective coat thereon; and
   detaching said chip, coated with said protective coat, from said adhesive tape.

3. A method according to claim 1, wherein step (h) is performed by soaking said package in a solvent together with said chip, said solvent dissolving said protective coat.

4. A method according to claim 1, further comprising the step of drying said chip and said package by heating said base at a pressure lower than atmospheric pressure.

5. A method of manufacturing a semiconductor device, comprising the steps of:
   (a) forming first, second, and third wiring layers on a surface of a wafer, wherein said third wiring layer is arranged between said first and said second wiring layers;
   (b) coating surfaces of said first, second, and third wiring layers and a remaining exposed surface of said wafer with a resist;
   (c) partially removing said resist to expose a part of the surfaces of said first and second wiring layers;
   (d) coating said exposed surfaces of said first and second wiring layers, and a surface of said resist with a fourth wiring layer to connect said first wiring layer to said second wiring layer via said fourth wiring layer;

(e) removing said resist arranged between said fourth wiring layer and said third wiring layer to form an air gap between said third and fourth wiring layers, thereby forming an air bridge structure on said wafer;

(f) forming a chip from said wafer having said air bridge structure, said chip being covered with a protective coat;

(g) fixing said chip, having a surface coated with said protective coat, to a base;

(h) removing said protective coat from said chip while keeping said chip fixed on said base; and (i) fixing said base to a package.

6. A method according to claim 5, wherein said step (f) comprises the steps of:

adhering said wafer on an adhesive tape;

coating a surface of said wafer with said protective coat;

dicing said wafer to form said chip, while keeping said protective coat thereon; and detaching said chip, coated with said protective coat, from said adhesive tape.

7. A method according to claim 5, wherein step (h) is performed by soaking said base in a solvent together with said chip, said solvent dissolving said protective coat.

8. A method according to claim 5, further comprising the step of drying said chip and said base by heating said base at a pressure lower than atmospheric pressure.

* * * * *